United States Patent [19]

Masumoto et al.

[11] Patent Number: 5,646,445
[45] Date of Patent: Jul. 8, 1997

[54] SEMICONDUCTOR DEVICE HAVING ELECTRODES EMBEDDED IN AN INSULATING CASE

[75] Inventors: Toshikazu Masumoto; Shinobu Takahama, both of Tokyo, Japan

[73] Assignee: Mitsubishi Denki Kabushiki Kaisha, Tokyo, Japan

[21] Appl. No.: 568,426

[22] Filed: Dec. 6, 1995

[30] Foreign Application Priority Data

Jul. 7, 1995 [JP] Japan .................. 7-172172

[51] Int. Cl.$^6$ .................. H01L 23/12; H01L 23/02
[52] U.S. Cl. .................. 257/723; 257/712; 257/706; 257/725; 257/730; 257/717; 257/713; 257/788; 257/703
[58] Field of Search .................. 257/723, 724, 257/725, 730, 799, 717, 712, 707, 713, 788, 669, 683, 698, 703, 675, 706, 704, 705

[56] References Cited

U.S. PATENT DOCUMENTS 4,172,261  10/1979  Tsuzuki et al. .................. 257/706

FOREIGN PATENT DOCUMENTS

| 2819499 | 11/1979 | Germany | 257/796 |
|---|---|---|---|
| 3309679 | 9/1984 | Germany | 257/788 |
| 63-93126 | 4/1988 | Japan . | |
| 2-178954 | 7/1990 | Japan . | |
| 0213863 | 8/1992 | Japan | 257/712 |
| 6-342872 | 12/1994 | Japan . | |

*Primary Examiner*—Sara W. Crane
*Assistant Examiner*—Alexander Oscar Williams
*Attorney, Agent, or Firm*—Oblon, Spivak, McClelland, Maier & Neustadt, P.C.

[57] ABSTRACT

In order to maintain parasitic inductances of main electrodes at low levels also during operation of a semiconductor device, upright portions of main electrode plates serving as paths of main currents are sealed in a side wall portion of a resin case, whereby the main electrode plates are fixed to the case while being maintained in parallel with each other. Further, lower end portions are opposed in parallel with each other through a flat insulating spacer. Thus, parasitic inductances caused in the main electrode plates are suppressed. Further, the lower end portions are not fixed to a circuit board but electrically connected to a power transistor through wires. Therefore, no deformation of the main electrodes is brought by thermal deformation of the circuit board following heat generation of the transistor, whereby the parallelism of the main electrode plates is maintained also during the operation of the device. Consequently, the parasitic inductances are maintained at low levels also during operation of the device.

20 Claims, 17 Drawing Sheets

SEMICONDUCTOR DEVICE HAVING ELECTRODES EMBEDDED IN AN INSULATING CASE

BACKGROUND OF THE INVENTION

1. Field of the Invention

The present invention relates to a semiconductor device such as a power switching semiconductor device, for example, and more particularly, it relates to an improvement for maintaining parasitic inductances of main electrode plates serving as paths for main currents at low levels also during operation of the device.

2. Description of the Background Art

FIG. 29 is a front sectional view showing a conventional power switching semiconductor device. As shown in FIG. 29, conductor foils 21a to 12g, which are so patterned as to form wires of a circuit, are bonded onto an upper surface of an insulating plate 21 which is formed by a ceramics plate in this conventional device, for forming a circuit board by the insulating plate 21 and the conductor foils 21a to 21g. The conductor foils 21a to 21g are substantially made of copper.

Power switching semiconductor elements E1 and E2 are provided on the circuit board. The power switching semiconductor elements E1 and E2, which are transistor elements, for example, are soldered to the conductor foils 21f and 21d respectively in states of unmolded semiconductor chips. Lower ends of main electrode plates 1 and 2 are soldered to the conductor foils 21c and 21b respectively.

The main electrode plates 1 and 2 are plate type electrodes for relaying main currents between the circuit on the circuit board and the exterior of the device. The respective conductor foils and the power switching semiconductor elements E1 and E2, or the conductor foils themselves are properly connected with each other through wires (bonding wires) 25. Referring to FIG. 29, the conductor foil 21c and the power switching semiconductor element E2, the power switching semiconductor element E2 and the conductor foil 21e, the conductor foil 21e and the power switching semiconductor element E1, and the power switching semiconductor element E1 and the conductor foil 21g are connected with each other through the wires 25 respectively. These wires 25 are substantially made of aluminum.

A radiation plate 9 which is made of a heat conductive metal such as aluminum or copper is bonded to the lower surface of the insulating plate 21. This radiation plate 9 is engaged in lower ends of side wall portions of a box-type case 11, to cover an opened lower end portion of the case 11 having the side wall portions and an upper end portion. Consequently, a storage chamber is defined by the case 11 and the radiation plate 9. The bottom surface of the radiation plate 9 is exposed to the exterior, in order to efficiently dissipate heat loss which is caused in circuit parts such as the power switching semiconductor elements E1 and E2.

The circuit parts such as the insulating plate 21, the power switching semiconductor elements E1 and E2 and the wires 25 are stored in the storage chamber, thereby being protected against the exterior. The storage chamber is filled up with two types of resin materials 41 and 42. The resin material 41, which is soft electrical insulating resin such as silicone resin, directly seals the circuit parts such as the power switching semiconductor elements E1 and E2 and the wires 25 provided on the circuit board. Further, the resin material 41 also seals portions of the main electrode plates 1 and 2 which are close to the lower ends.

The other resin material 42, which is hard electrical insulating resin such as epoxy resin, is not in direct contact with the circuit parts on the circuit board other than the main electrode plates 1 and 2, but seals a region of the storage chamber which is not filled up with the resin material 41. Namely, the soft resin material 41 is filled to serve as a buffer material between the hard resin material 42 and the circuit board. These resin materials 41 and 42 are filled up in the storage chamber for sealing the circuit board and the circuit parts provided thereon, thereby preventing penetration of water etc. from the exterior.

The main electrodes 1 and 2 are stored in the storage chamber, while upper ends thereof are outwardly exposed through the upper end portion of the case 11. The upper ends of the main electrode plates 1 and 2 are bent to cover nuts 31, which are embedded in the upper end portion of the case 11. The upper ends of the main electrode plates 1 and 2 are provided in portions opposed to holes of the nuts 31 with through holes, whereby the device can be fastened to an external unit through bolts.

The two main electrode plates 1 and 2 are mounted to be parallel to each other, so that parasitic inductances generated therein are suppressed. The main electrode plates 1 and 2 are further bent in a substantially S-shaped manner, in order to relax stress concentration, caused by thermal deformation of the insulating plate 21 as described later, at the connecting portions between the main electrode plates 1 and 2 and the conductor foils 21c and 21b. In order to effectively attain the effect of relaxing the stress concentration, the substantially S-shaped bent portions are sealed in the soft resin material 41, not to be deformed or interfered by the hard resin material 42.

In this conventional device, the power switching semiconductor elements E1 and E2 are switched on (conduct) and off (cut off) in response to control signals which are inputted therein through control terminals (not shown). In response to the operations of the power switching semiconductor elements E1 and E2, main currents intermittently flow through the main electrode plates 1 and 2. Namely, this device serves as a switching semiconductor device.

In this conventional device, the heat loss which is caused in the power switching semiconductor elements E1 and E2 upon operation of the device is successively conducted from the conductor foils 21f and 21d through the insulating plate 21 and the radiation plate 9, to be dissipated toward an external cooling body (not shown) on which the radiation plate 9 is mounted. At this time, the insulating plate 21 and the radiation plate 9 are thermally distorted due to difference in thermal expansion coefficient therebetween. Consequently, the insulating plate 21 and the radiation plate 9 are deformed to be bent.

The main electrode plates 1 and 2, which are fixed to the insulating plate 21 through the conductor foils 21c and 21b respectively, are also deformed following the thermal deformation of the insulating plate 21. The substantially S-shaped bent portions of the main electrode plates 1 and 2, which are sealed in the soft resin material 41 as hereinabove described, are relatively freely deformed following the thermal deformation of the insulating plate 21. Further, the resin material 41 is also thermally expanded to deform the bent portions which are sealed in the resin material 41. Consequently, the parallel relation between the main electrode plates 1 and 2 cannot be maintained and the effect of reducing parasitic inductances is reduced.

Further, considerable stress concentrically acts on the connecting portions between the main electrode plates 1 and 2 and the conductor foils 21c and 21b, although this stress is relaxed by the substantially S-shaped bent portions. Consequently, the connecting portions may be broken following repetitive employment over a long period.

In the conventional power switching semiconductor device, as hereinabove described, the main electrode plates 1 and 2 are fixed to the insulating plate 21 and hence the parallelism is reduced following employment of the device, to cause parasitic inductances or damage the connecting portions due to stress concentration.

SUMMARY OF THE INVENTION

According to a first aspect of the present invention, a semiconductor device comprises a circuit board which is provided on a bottom surface portion of a box type electrically insulating case, a semiconductor element which is provided on the circuit board for controlling a main current, and a pair of main electrodes having first end portions which are electrically connected with the semiconductor element and second end portions which are outwardly exposed from an upper end surface of the case so that the main current flows in opposite directions, while the pair of main electrodes are sealed in the interior of a side wall portion of the case in substantially parallel positional relation thereby being fixed to the case, and the first end portions of the pair of main electrodes are not directly coupled to the circuit board but electrically connected to the semiconductor element through bonding wires.

According to a second aspect of the present invention, the respective ones of the first end portions of the pair of main electrodes are in the form of plates having opposed portions which are opposed in parallel with each other through a flat plate type insulator sandwiched therebetween, and parts of the respective ones of the opposed portions and the insulator are sealed in the interior of the side wall portion.

According to a third aspect of the present invention, plate-type first end portions of the pair of main electrodes are parallel to an inner surface of the bottom surface portion, while that of the first end portions which is closer to the bottom surface portion outwardly extends beyond the opposed portions.

According to a fourth aspect of the present invention, projections are provided on both major surfaces of the insulator respectively while through holes are provided in the opposed portions of the first end portions of the pair of main electrodes respectively, so that the projections are engaged in the through holes.

According to a fifth aspect of the present invention, a plurality of projections are provided on each of the major surfaces.

According to a sixth aspect of the present invention, at least one of the projections protrudes from that of the through holes which is engaged therewith and is sealed in the side wall portion.

According to a seventh aspect of the present invention, the forward end portion of the projection protruding from that of the through holes which is engaged therewith reaches an outer surface of the bottom surface portion of the case.

According to an eighth aspect of the present invention, still another through hole which is filled up with a material forming the side wall portion is formed in at least one of the opposed portions of the first end portions of the pair of main electrodes.

According to a ninth aspect of the present invention, plate-type first end portions of the pair of main electrodes are parallel to an inner surface of the bottom surface portion, and a first major surface of flat plate type another insulator is in contact with one of the first end portions which are closer to the bottom surface portion on a major surface opposite to that in contact with the insulator, while another major surface of the another insulator is flush with an outer surface of the bottom surface portion of the case.

According to a tenth aspect of the present invention, the pair of main electrodes are in the form of plates, and a plate-type arm portion which is opposed in parallel to a major surface of one of the main electrodes protrudes with a flat insulator being sandwiched therebetween from the other of main electrodes in portions of the pair of main electrodes which are sealed in the interior of the side wall portion.

According to an eleventh aspect of the present invention, the pair of main electrodes are in the form of plates, and the first end portions of the pair of main electrodes are parallel to an inner surface of the bottom surface portion, while the pair of main electrodes are sealed in the side wall portion in connecting portions connecting respectively the first end portions with the second end portions and in parts of the first end portions, and have opposed portions where the major surfaces are opposed in parallel with each other in both of the connecting portions and the first end portions.

According to a twelfth aspect of the present invention, the opposed portions are opposed to each other through a flat portion of an insulator sandwiched therebetween, the insulator has the flat portion, and at least a part of the insulator is sealed in the side wall portion.

In the device according to the first aspect of the present invention, the pair of main electrodes in which the main current flows in opposite directions are substantially parallel to each other, whereby parasitic inductances caused in the main electrodes are suppressed. Further, the main electrodes are sealed in the side wall portion of the case thereby being fixed to the case, and electrically connected to the semiconductor element through the bonding wires to avoid direct coupling to the circuit board, whereby the same are not deformed by thermal deformation of the circuit board following heat generation of the semiconductor element. Further, there is no apprehension that thermal stress is concentrated to parts of the main electrodes.

Due to no deformation following heat generation of the semiconductor element, the pair of main electrodes are maintained in substantially parallel relation also during operation of the device. Thus, parasitic inductances are not increased during operation of the device, and stable operation is implemented. Further, reliability of the device is improved since the same is not damaged by concentration of thermal stress.

In the device according to the second aspect of the present invention, the plate-type first end portions of the pair of main electrodes have portions which are opposed in parallel with each other, whereby parasitic inductances are particularly reduced in the opposed portions. Further, the opposed portions sandwitch the flat plate type insulator therebetween, whereby the parallelism in these portions is implemented in high accuracy. Since parts of the respective ones of the opposed portions and the insulator are sealed in the interior of the side wall portion, sealing is carried out in fabrication steps of the device with the insulator previously being held by the opposed portions therebetween.

In the finished device after the sealing, therefore, it is guaranteed that the parallelism of the opposed portions is attained in high accuracy. Further, high parallelism is implemented through a simple method of previously holding the insulator. Since the insulator is interposed between the opposed portions from the initial stage, those voids are not defined in a sealing medium for filling up the clearance between the opposed portions which deteriorate the withstand voltage.

In the device according to the third aspect of the present invention, the plate-type first end portions of the pair of main electrodes are parallel to the inner side surface of the bottom surface portion of the case while that of the first end portions closer to the bottom surface portion juts out from the opposed portions, whereby an operation of connecting the bonding wires to the first portions can be readily performed through an automatic bonding apparatus.

In the device according to the fourth aspect of the present invention, the projections which are provided on both major surfaces of the insulator are engaged in the through holes provided in the portions of the main electrodes which are in contact with the insulator, thereby restricting relative movement of the opposed portions of the first end portions of the main electrodes. When the main electrodes are sealed in the side wall portion, therefore, misregistration between the opposed portions is suppressed, whereby parallelism in these portions can be more readily implemented in high accuracy.

In the device according to the fifth aspect of the present invention, a plurality of projections are provided on each of the major surfaces, whereby relative movement of the opposed portions of the main electrodes is completely constrained. When the main electrodes are sealed in the side wall portion, therefore, misregistration between the opposed portions is suppressed, whereby parallelism in these portions can be further more readily implemented in high accuracy.

In the device according to the sixth aspect of the present invention, at least one of the projections protrudes from the through hole which is engaged therewith, and is sealed in the side wall portion. Therefore, the first end portions of the main electrodes and the case are prevented from misregistration.

In the device according to the seventh aspect of the present invention, the forward end portion of the protruding projection reaches the outer side surface of the bottom surface portion of the case, whereby it is possible to fix the main electrodes to a mold for sealing by bringing the forward end portion into contact with the surface of the mold. Thus, it is possible to more effectively prevent the main electrodes and the case from misregistration thereby further accurately setting the positional relation between the main electrodes and the case.

In the device according to the eighth aspect of the present invention, the through hole which is filled up with the material for forming the side wall portion is formed in at least either one of the opposed portions of the first end portions of the pair of main electrodes, whereby the first end portions of the main electrodes and the case are prevented from misregistration.

In the device according to the ninth aspect of the present invention, another flat plate-type insulator is so provided that it is possible to fix the main electrodes to the mold by bringing the bottom surface of this insulator into contact with the surface of the mold for sealing and placing the opposed portions of the main electrodes on the upper surface of the insulator in sealing of the main electrodes. Thus, it is possible to more effectively prevent the main electrodes and the case from misregistration for further accurately setting the positional relation between the main electrodes and the case.

In the device according to the tenth aspect of the present invention, the plate-type arm portion which is opposed in parallel to the major surface of one of the main electrodes through the flat insulator protrudes in the portions of the plate-type pair of main electrodes which are sealed in the side wall portion, whereby accuracy of the parallelism is improved in the portions sealed in the side wall portion.

In the device according to the eleventh aspect of the present invention, the plate-type pair of main electrodes have portions where the major surfaces are opposed in parallel with each other in both of parts of the first end portions and the connecting portions, whereby parasitic inductances caused in the main electrodes are particularly suppressed.

In the device according to the twelfth aspect of the present invention, both major surfaces of the pair of plate-type main electrodes are opposed to each other through the flat portion of the insulator, whereby parallelism is implemented in high accuracy in these portions. Further, at least a part of the insulator is sealed in the interior of the side wall portion, whereby sealing is carried out in such a state that the insulator is previously held by the opposed portions in the fabrication steps for the device. Thus, it is guaranteed that parallelism of the opposed portions is attained in high accuracy in the finished device after sealing.

Accordingly, an object of the present invention is to obtain a semiconductor device which guarantees a stable operation by suppressing occurrence of parasitic inductances caused by thermal deformation of a circuit board and damage of the device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<1. First Embodiment>

First, a first embodiment of the present invention is described.

<1—1. Overall Structure of Device>

Figure 2:
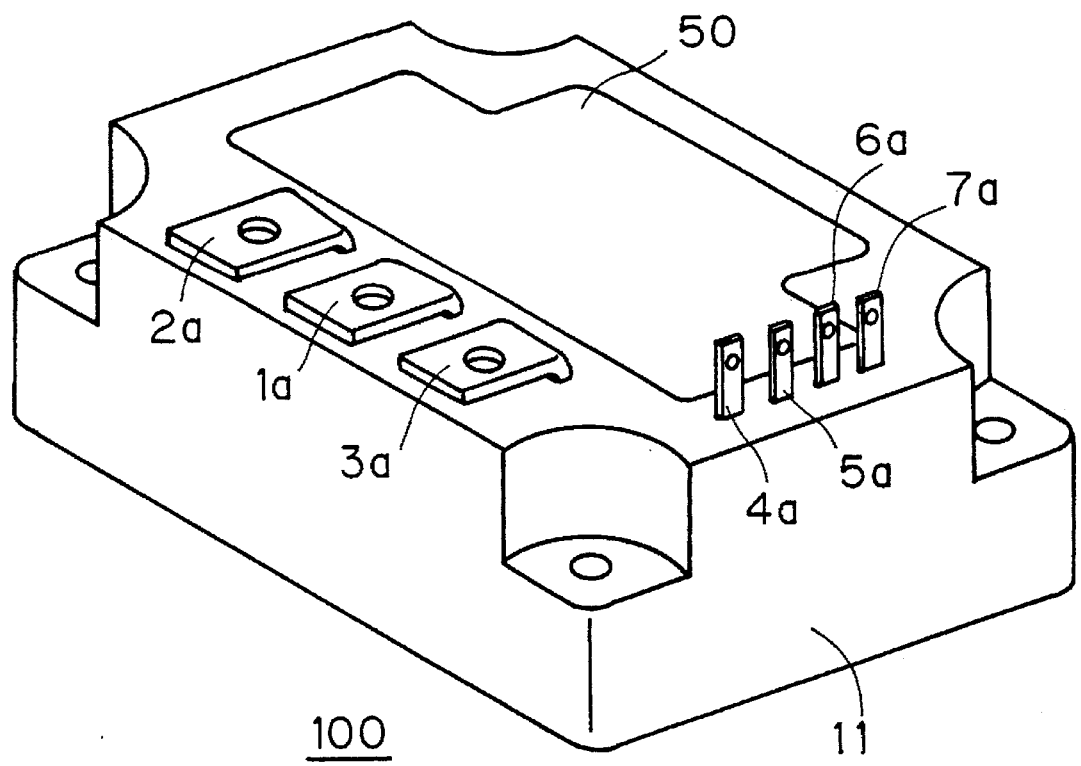
FIG. 2 is a perspective view showing the appearance of the device according to the first embodiment.
Figure 29:
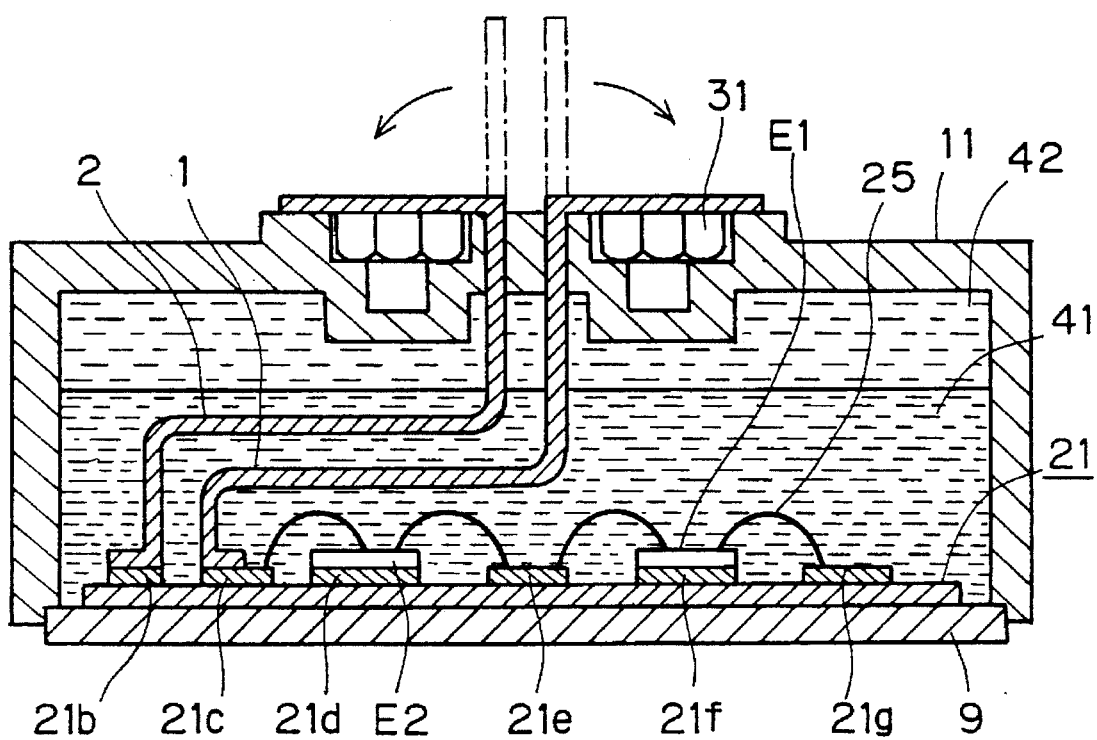
FIG. 29 is a front sectional view showing a conventional device.

FIG. 2 is a perspective view showing the appearance of a power switching semiconductor device 100 according to the first embodiment of the present invention. In the following figures, portions which are identical to or serve functions identical to those of the conventional device shown in FIG. 29 are denoted by the same reference numerals.

As shown in FIG. 2, an opening portion is formed in an upper end surface of a case 11 in the device 100 of this embodiment, and a lid 50 is fixed to the case 11 for covering the opening portion. The case 11 is made of electrical insulating resin, which is preferably prepared from PPS resin or PBT resin. The lid 50 is also made of electrical insulating resin. Upper end portions 1a, 2a and 3a of three main electrode plates 1, 2 and 3 as well as upper end portions 5a, 6a, 7a and 8a of four signal electrodes 5, 6, 7 and 8 are exposed on the upper end surface of the case 11.

Figure 3:
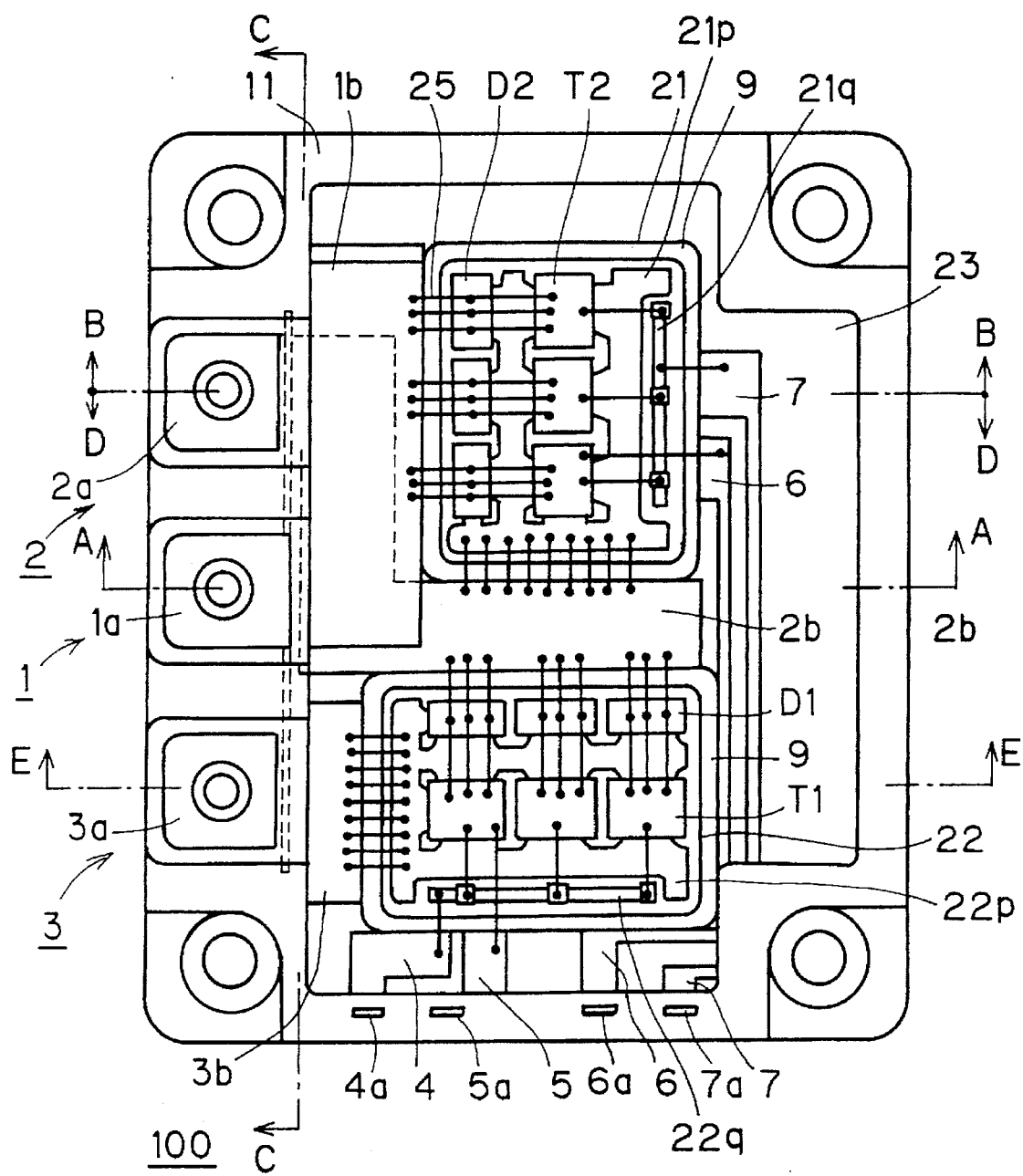
FIG. 3 is a plan view showing the device according to the first embodiment.

FIG. 3 is a plan view of the device 100, from which the lid 50 is removed. Two opening portions are formed in a bottom surface portion 23 of the box-type case 11, and insulating plates 21 and 22 which are fixed to an upper surface of a radiation plate 9 are inserted in the opening portions respectively. Patterned conductor foils 21p and 21q are coupled onto the insulating plate 21, while patterned conductor foils 22p and 22q are similarly coupled onto the insulating plate 22.

The insulating plate 21 and the conductor foils 21p, 21g form a circuit board. The insulating plate 22 and the conductor foils 22p, 22g form another circuit board. Similarly to the conventional device, the insulating plates 21 and 22 are formed by ceramics plates, for example, and the conductor foils 21p, 21q, 22p and 22q are substantially made of copper.

A power transistor (semiconductor element) T2 and a diode D2 are soldered onto the conductor foil 21p. Further, a power transistor (semiconductor element) T1 and a diode D1 are soldered onto the conductor foil 22p. Every one of these transistors T1 and T2 and diodes D1 and D2 has three semiconductor chips which are connected in parallel with each other. The transistors T1 and T2 and the diodes D1 and D2 are electrically connected with the main electrode plates 1, 2 and 3.

Figure 4:
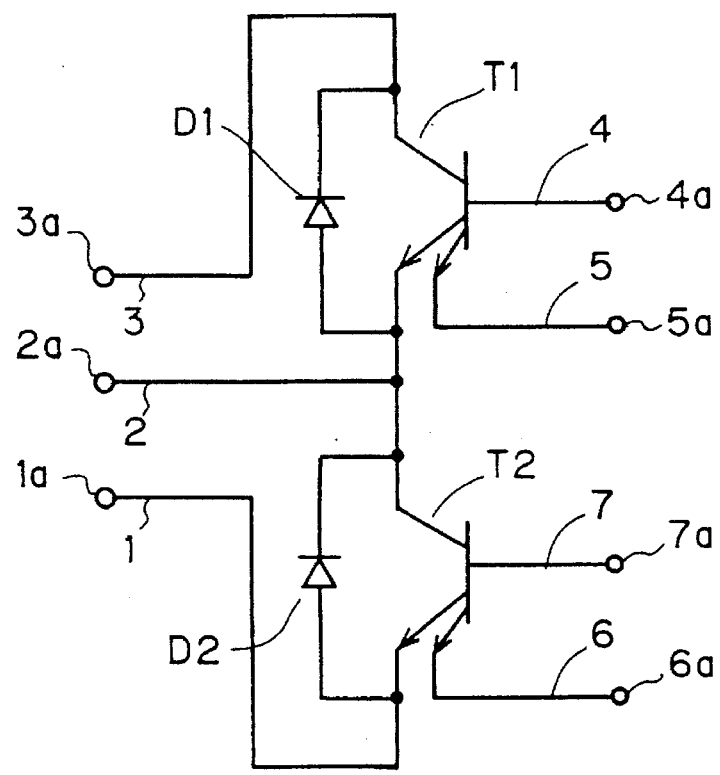
FIG. 4 is a circuit diagram of the device according to the first embodiment.

FIG. 4 is a circuit diagram of the device 100. The transistor T1 and the diode D1 are connected in antiparallel with each other. Namely, the collector of the transistor T1 is connected with the cathode of the diode D1, while the emitter of the former is connected with the anode of the latter. Similarly, the transistor T2 and the diode D2 are connected in antiparallel with each other.

On the other hand, the transistors T1 and T2 are connected in series with each other. Namely, the emitter of the transistor T1 is connected with the collector of the transistor T2. Further, the main electrode plates 3, 2 and 1 are connected to the collector of the transistor T1, the emitter of the transistor T1 (i.e., the collector of the transistor T2), and the emitter of the transistor T2 respectively.

The respective ones of the transistors T1 and T2 comprise sense electrodes which are fed with sense currents, which are feeble currents being proportionate to emitter currents, and the signal electrodes 5 and 6 are connected to these sense electrodes respectively. Further, the signal electrodes 4 and 7 are connected to the bases of the transistors T1 and T2 respectively. The main electrode plates 1, 2 and 3 are coupled to the aforementioned upper end portions 1a, 2a and 3a respectively, while the signal electrodes 4, 5, 6 and 7 are coupled to the aforementioned upper end portions 4a, 5a, 6a and 7a respectively.

As understood from the circuit diagram of FIG. 4, collector currents (main currents) of the transistors T1 and T2 flow to the main electrode plates 1, 2 and 3. On the other hand, base or sense currents flow to the signal currents 4, 5, 6 and 7. Namely, large currents for supplying power to loads flow to the main electrode plates 1, 2 and 3, while only feeble currents which are by far smaller than the same flow to the signal electrodes 4, 5, 6 and 7.

The base currents are alternately inputted in the signal electrodes 4 and 7, thereby alternately turning on/off the transistors T1 and T2. Consequently, the main currents oppositely flow across the main electrode plates 1 and 2 and across the main electrode plates 2 and 3 respectively. Namely, the main currents flow through the main electrode plate 2 from the upper end portion 2a to the transistor T2 while oppositely flowing through the main electrode plate 1 from the transistor T2 to the upper end portion 1a. This also applies to the main electrode plates 2 and 3.

Referring again to FIG. 3, lower end portions (first end portions) 1b, 2b and 3b of the main electrode plates 1, 2 and 3 are arranged on an inner side surface of the bottom surface portion 23. The emitter of the transistor T2 and the anode of the diode D2 are electrically connected to the lower end portion 1b through wires (bonding wires) 25. Similarly, the emitter of the transistor T1 and the anode of the diode D1 are electrically connected to the lower end portion 2b through wires (bonding wires) 25.

Further, the collector of the transistor T2 and the cathode of the diode D2 electrically connected to the lower end portion 2b throught the conductor foil 21p to which the same are fixed and wires 25 which are connected to the conductor foil 21p. Similarly, the collector of the transistor T1 and the cathode of the diode D1 are electrically connected to the lower end portion 3b through the conductor foil 22p to which the same are fixed and wires 25 which are connected to the conductor foil 22p. The main electrode plates 1, 2 and 3 are preferably formed by copper materials having nickel-plated surfaces, to be connected with the wires 25 in excellent states.

Further, the base of the transistor T1 is electrically connected to the signal electrode 4 through the wire 25 and the conductor foil 22q. Similarly, the base of the transistor T2 is electrically connected to the signal electrode 7 through the wire 25 and the copper foil 21q. Further, the sense electrodes of the transistors T1 and T2 are electrically connected to the signal electrodes 5 and 6 respectively through the wires 25.

Figure 5:
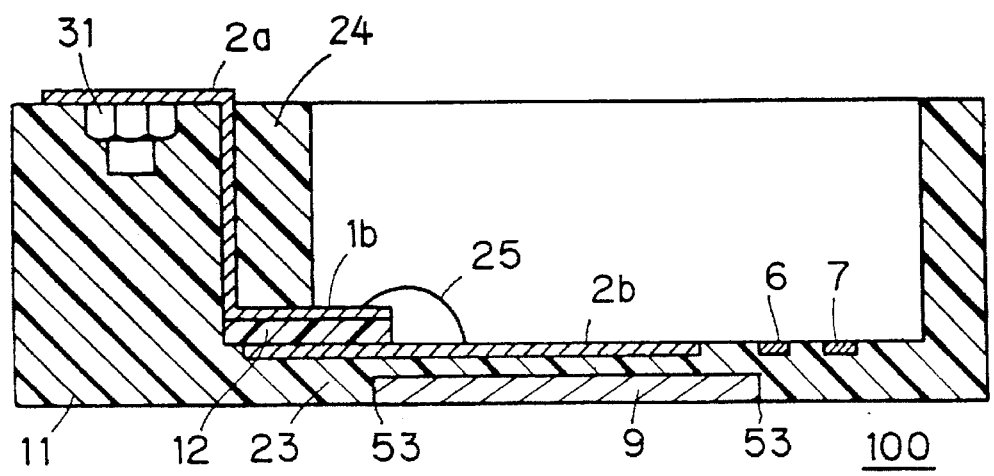
FIG. 5 is a sectional view of the device according to the first embodiment taken along the line A—A.
Figure 6:
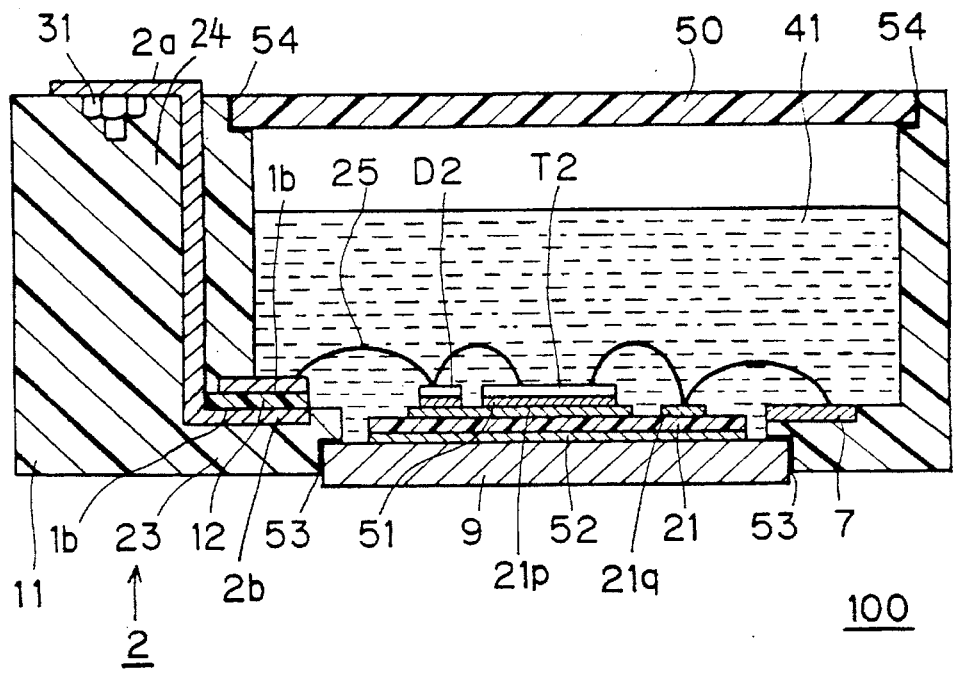
FIG. 6 is a sectional view of the device according to the first embodiment taken along the line B—B.

FIGS. 5 and 6 are sectional views taken along the lines A—A and B—B in FIG. 3 respectively. Referring to FIG. 5, the lid 50 and a resin material 41 are omitted. As shown in these figures, the radiation plate 9 is inserted in a groove which is formed in the bottom surface portion 23. An adhesive 53 is applied between the inner end surface of the groove and the outer peripheral end surface of the radiation plate 9, so that the radiation plate 9 is fixed to the bottom surface portion 23 by the adhesive 53. The bottom surface of the radiation plate 9, i.e., a major surface opposite to the upper surface to which the insulating plate 21 is fixed is outwardly exposed so that radiation to the exterior is effectively performed, and protrudes outwardly (downwardly) beyond the outer surface of the bottom surface portion 23, in order to guarantee contact with an external cooling body.

The insulating plate 21 which is fixed to the upper surface of the radiation plate 9 is inserted in an opening portion formed in the bottom surface portion 23 of the case 11. An unpatterned conductor foil (not shown) is coupled to the lower surface of the insulating plate 21, and this conductor foil is fixed to the upper surface of the radiation plate 9 through solder 52. The transistor T2 and the diode D2 are fixed to the upper surface of the conductor foil 21p, which is coupled to the upper surface of the insulating plate 21, by solder 51. The solder materials 51 and 52 have melting points which are higher than that of ordinary solder, while a material having the highest melting point is selected for the solder 52, in particular.

When the device 100 operates, heat loss is caused mainly in the transistors T1 and T2. This heat loss is transmitted to the insulating plate 21 through the conductor foils 22p and 21q, and further transmitted to the radiation plate 9, to be dissipated to the external cooling body.

The lid 50 covering the upper end surface of the case 11 is fixed to the case 11 by an adhesive 54. A storage chamber is defined in the interior by the case 11, the radiation plate 9 and the lid 50. Circuit parts such as the insulating plates 21 and 22, the transistors T1 and T2 and the wires 25 are stored in this storage chamber, and sealed with soft resin 41 such as silicone resin, to be protected against external water etc.

<1—2. Structure of Main Electrode Plate>

Nuts 31 are embedded in an upper end of a side wall portion 24 of the case 11, and the upper end portions (second end portions) 1a, 2a and 3a of the main electrode plates 1, 2 and 3 are bent to cover the nuts 31. Through holes are formed in portions of the upper end portions 1a, 2a and 3a which are opposed to holes of the nuts 31, whereby the device can be fastened to an external unit through bolts.

An electrical insulating fiat plate-type spacer (insulator) 12 is interposed between the lower end portions 1b and 2b of the main electrode plates 1 and 2. The spacer 12 is preferably made of PPS resin or PBT resin. Both of the lower end portions 2b and 3b are embedded in the inner side surface of the bottom surface portion 23 so that upper surfaces thereof are exposed, to be fixed to the bottom surface portion 23. FIGS. 5 and 6 illustrate the lower end portions 1b and 2b representing the lower end portions 1b, 2b and 3b.

The main electrode plates 1, 2 and 3 are not fixed to the insulating plate 21, but sealed in the side wall portion 24 of the case 11, thereby being fixed to the case 11. The main electrode plates 1, 2 and 3 are electrically connected with the transistors T1 and T2 on the insulating plates 21 and 22 through the wires 25, as hereinabove described. Thus, there is no apprehension that the main electrode plates 1, 2 and 3 are deformed or thermal stress is concentrated to parts of the main electrode plates 1, 2 and 3 or parts of the insulating plates 21 and 22 following thermal deformation of the insulating plates 21 and 22 resulting from heat loss of the transistors TI and T2 etc. or thermal expansion of the resin 41.

Figure 1:
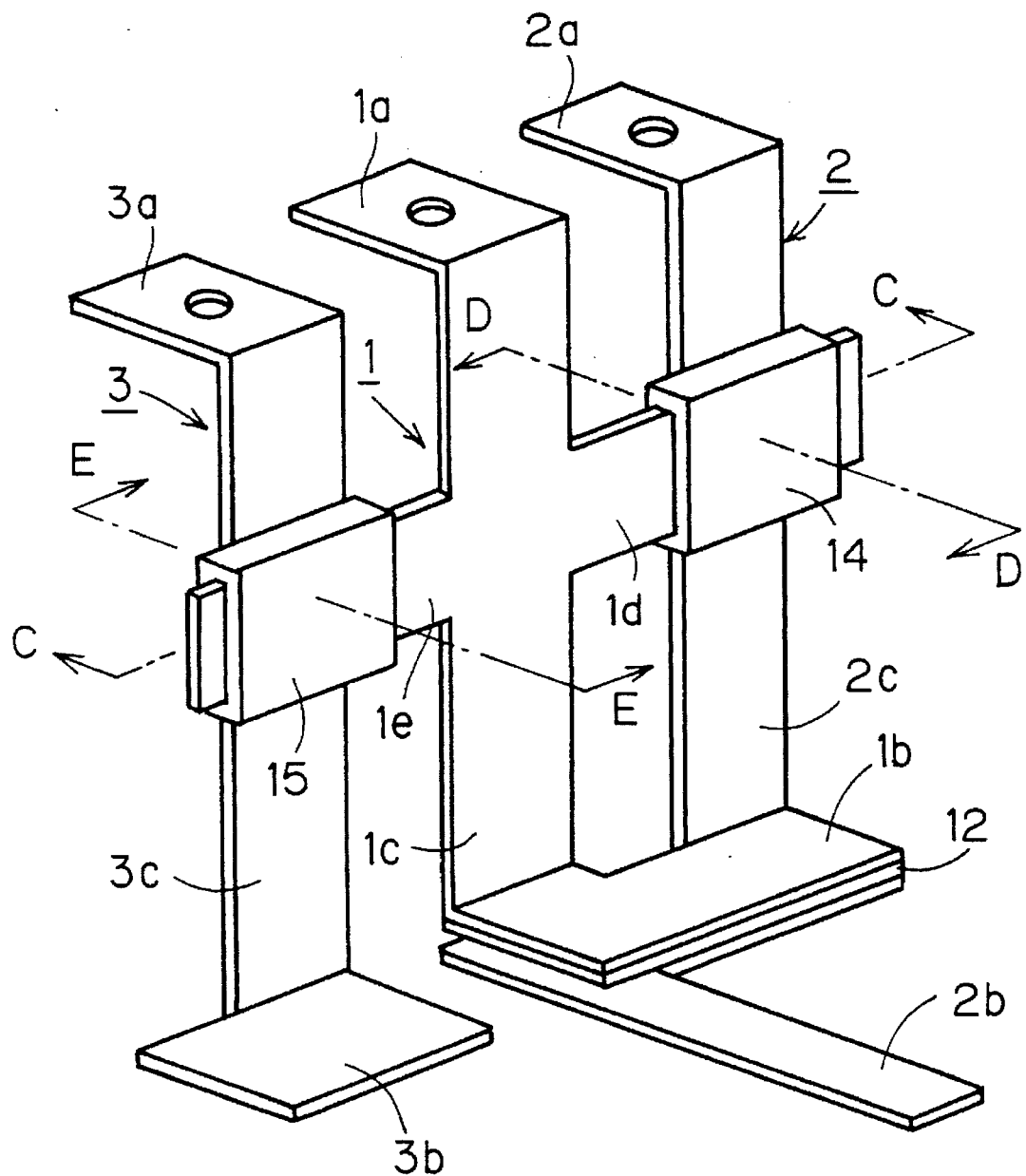
FIG. 1 is a perspective view showing main electrode plates of a device according to a first embodiment of the present invention.
Figure 7:
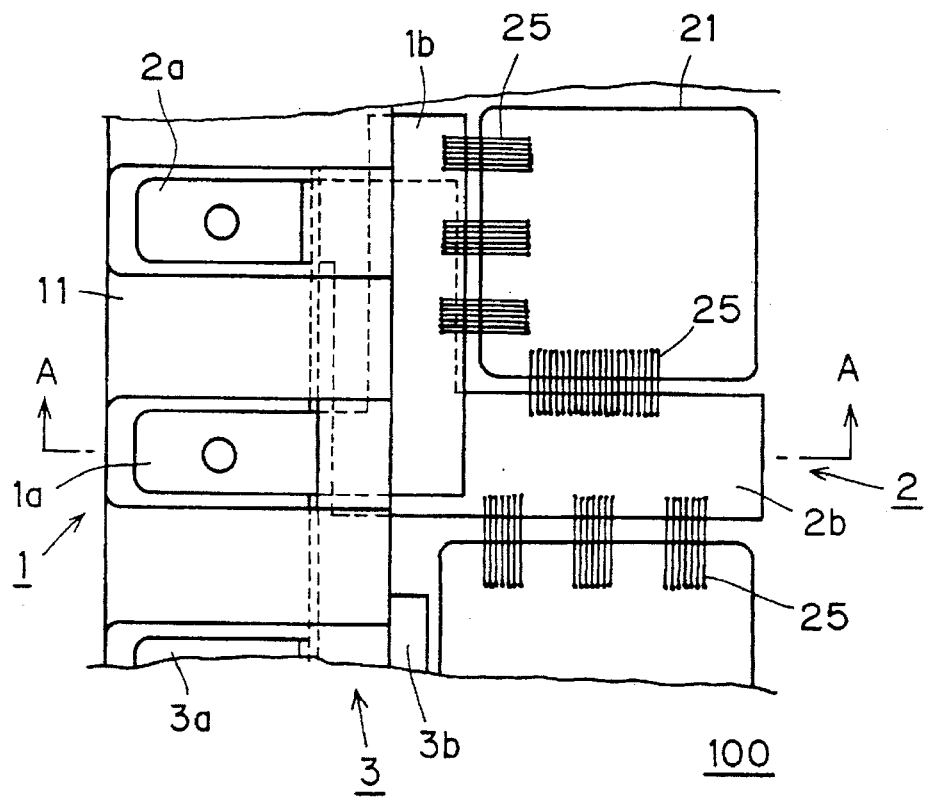
FIG. 7 is a partially enlarged plan view showing the device according to the first embodiment.
Figure 8:
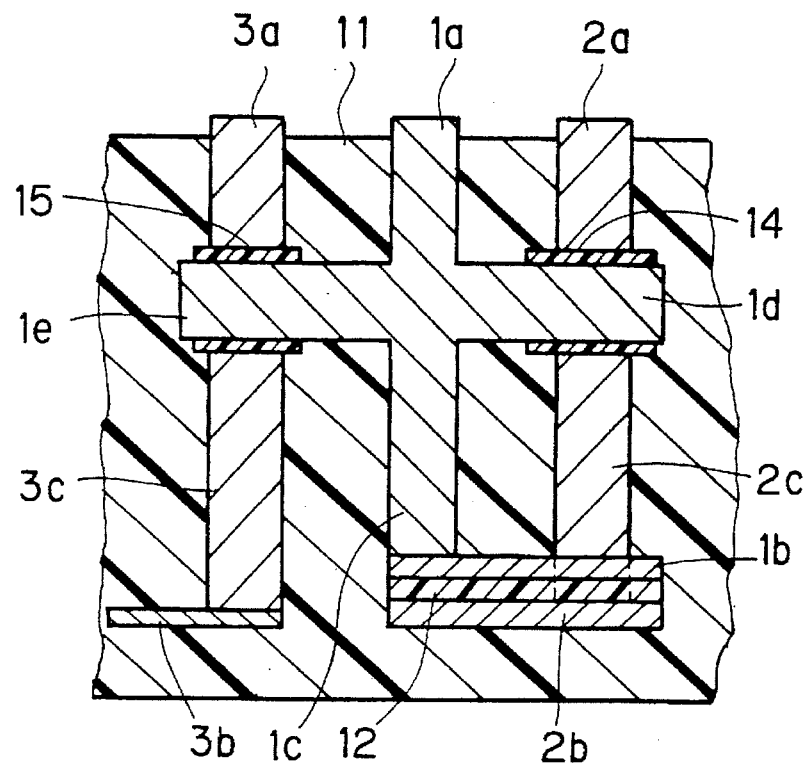
FIG. 8 is a partially fragmented sectional view of the device according to the first embodiment taken along the line C—C.
Figure 9:
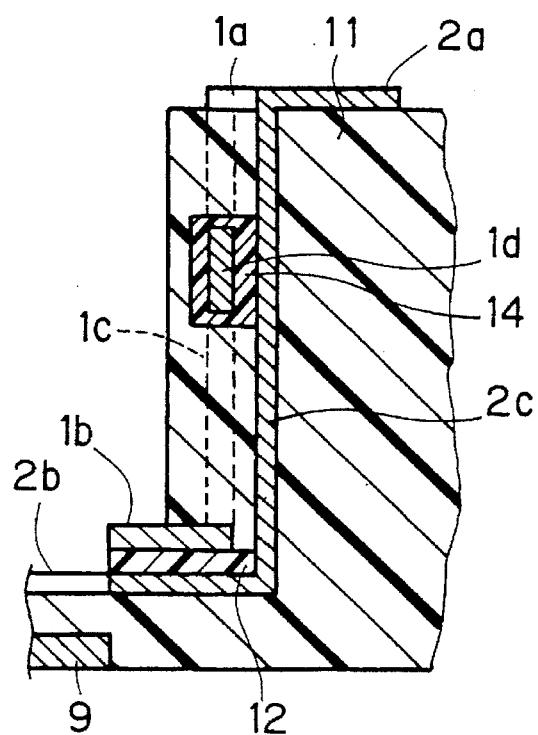
FIG. 9 is a partially fragmented sectional view of the device according to the first embodiment taken along the line D—D.
Figure 10:
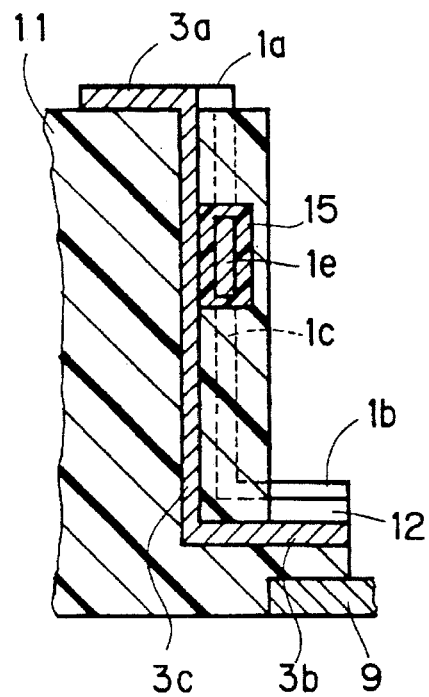
FIG. 10 is a partially fragmented sectional view of the device according to the first embodiment taken along the line E—E.

FIG. 7 is a partially enlarged plan view of the device 100. FIG. 1 is a perspective view showing the mutual positional relation between the main electrode plates 1, 2 and 3 which are sealed in the case 11. Further, FIGS. 8, 9 and 10 are sectional views taken along the lines C—C, D—D and E—E in FIG. 1 respectively. FIGS. 8 to 10 also illustrate the case 11, in addition to the main electrode plates 1, 2 and 3. With reference to FIGS. 1 and 7 to 10, the structures of the main electrode plates 1, 2 and 3 are now described in further detail.

The main electrode plates 1, 2 and 3 are sealed in the side wall portion 24 of the case 11 in upright portions (connecting portions) 1c, 2c and 3c connecting the upper end portions 1a, 2a and 3a and the lower end portions 1b, 2b and 3b with each other respectively. Further, parts of the lower end portions 1b, 2b and 3b and a part of the spacer 12 are also sealed in the side wall portion 24.

The mutual positions of the main electrode plates 1, 2 and 3 are so decided that the same are parallel to each other. Namely, the upper end portions 1a, 2a and 3a are parallel to each other, while the lower end portions 1b, 2b and 3b which are provided along the inner side surface of the bottom surface portion 23 are also parallel to each other. Further, the upright portions 1c, 2c and 3c are also parallel to each other.

In addition, the main currents flow through the adjacent main electrode plates 1 and 2 in an antiparallel manner, i.e., oppositely in parallel with each other. The main currents also flow through the adjacent main electrode plates 1 and 3 in antiparallel with each other. Namely, the mutual positional relation between the main electrodes 1, 2 and 3 is so set that parasitic inductances caused therein are reduced.

As hereinabove described, the lower end portion 1b is connected to the transistor T2 on the insulating plate 21 through the wire 25 and the lower end portion 3b is connected to the conductor foil 22p of the insulating plate 22 also through the wire 25, while the lower end portion 2b is connected to both of the conductor foil 21p on the insulating plate 21 and the transistor T1 on the conductor foil 22p of the insulating plate 22 through the wires 25. These lower end portions 1b, 2b and 3b are so arranged as to be most approximate to the objects to which the same are connected.

Namely, the lower end portion 1b is arranged to be adjacent to the insulating plate 21, the lower end portion 2b is arranged between the insulating plates 21 and 22 to be adjacent to both of these insulating plates 21 and 22, and the lower end portion 3b is arranged to be adjacent to the insulating plate 22. Therefore, it is possible to attain such an advantage that the main electrode plates 1, 2 and 3 and the insulating plates 21 and 22 can be readily connected with each other while reducing the wires 25 in length.

The lower end portions 1b and 2b overlap with each other through the spacer 12. Further, the lower end portion 2b which is positioned downwardly beyond the lower end portion 1b (i.e., closer to the bottom surface portion 23) in the overlapping portion juts out from the overlapping portion along the inner side surface of the bottom surface portion 23. Thus, the wires 25 can be connected to both of the lower end portions 1b and 2b.

In addition, the lower end portions 1b, 2b and 3b are mounted to be substantially flush with the upper surface of the insulating plate 21. Thus, connection by the wires 25 can be readily and efficiently carried out through an automatic bonding apparatus.

In the overlapping portion of the lower end portions 1b and 2b, the main electrode plates 1 and 2 are separated from each other by the flat plate type spacer 12. Therefore, major surfaces of the lower end portions 1b and 2b are opposed to each other in this overlapping portion, and maintained parallel in high accuracy. The main currents flow through the lower end portions 1b and 2b in antiparallel with each other in this overlapping portion. Further, the thickness of the spacer 12 is typically set at about 0.5 mm to 5 min. Therefore, the parasitic inductances are particularly suppressed in this overlapping portion.

When the main electrode plates 1, 2 and 3 are sealed in the case 11, the spacer 12 is previously interposed between the lower end portions 1b and 2b. Namely, the main electrode plates 1, 2 and 3 are sealed in the case 11 with interposition of the spacer 12 between the lower end portions 1b and 2b. Thus, it is guaranteed that parallelism of the lower end portions 1b and 2b is attained in high accuracy after the main electrode plates 1, 2 and 3 are sealed in the case 11. While the clearance between the lower end portions 1b and 2b is typically set at 0.5 mm to 5 mm as hereinabove described, there is no such apprehension that voids are collected between the lower end portions 1b and 2b during the sealing process to deteriorate the withstand voltage, due to the previous interposition of the spacer 12.

The upright portion 1c of the main electrode plate 1 which is arranged at the center among the main electrode plates 1, 2 and 3 has arm portions 1d and 1e horizontally protruding to be opposed to the upright portions 2c and 3c respectively. Other spacers (insulators) 14 and 15 are interposed between the arm portions 1d and 1e and parts of the upright portions 2c and 3c which are opposed thereto. Preferably, the spacers 14 and 15 are fixed to the arm portions 1d and 1e by receiving the arm portions 1d and 1e, as shown in FIGS. 1 and 8 to 10. The spacers 14 and 15, which are made of an electrical insulating material, are preferably made of the same material as that for the spacer 12.

As shown in FIGS. 9 and 10, the thicknesses of the spacers 14 and 15 enclosing the arm portions 1d and 1e are constant. Therefore, the upright portions 2c and 3c and the arm portions 1d and 1e so hold flat parts of the spacers 14 and 15 therebetween respectively that the upright portions 2c and 3c and the arm portions 1d and 1e are maintained parallel to each other with predetermined spaces in high accuracy.

Further, the spacers 14 and 15 are also previously interposed along with the spacer 12 when the main electrode plates 1, 2 and 3 are sealed in the case 11. Namely, the main electrode plates 1, 2 and 3 are sealed in the case 11 in such a state that the spacers 14 and 15 are interposed between the upright portions 2c and 3c and the arm portions 1d and 1e. Thus, it is guaranteed that parallelism between the upright portions 1c, 2c and 3c is attained in high accuracy after the main electrode plates 1, 2 and 3 are sealed in the case 11.

As hereinabove described, high accuracy is guaranteed for the parallelism between the main electrode plates 1, 2 and 3 after sealing since the main electrodes 1, 2 and 3 are sealed in the case 11 while being kept in parallel with each other by the spacers 12, 14 and 15 in this device 100. Further, parallelism of high accuracy can be readily attained by simply employing the spacers 12, 14 and 15, with no requirement for complicated steps.

In addition, the main electrode plates 1, 2 and 3 are fixed to the case 11 and connected to the insulating plates 21 and 22 through the wires 25, whereby there is no apprehension that the parallelism between the main electrode plates 1, 2 and 3 is deteriorated by heat generation following the operation of the device 100. Namely, high parallelism is regularly guaranteed between the main electrode plates 1, 2 and 3, whereby the parasitic inductances are regularly suppressed and stable operations are guaranteed.

The main electrode plates 1, 2 and 3 are not thermally deformed, whereby no stress is concentrated to parts of the main electrode plates 1, 2 and 3. Namely, a highly reliable device is implemented with no damage of the device caused by concentration of thermal stress.

<2. Second Embodiment>

Figure 11:
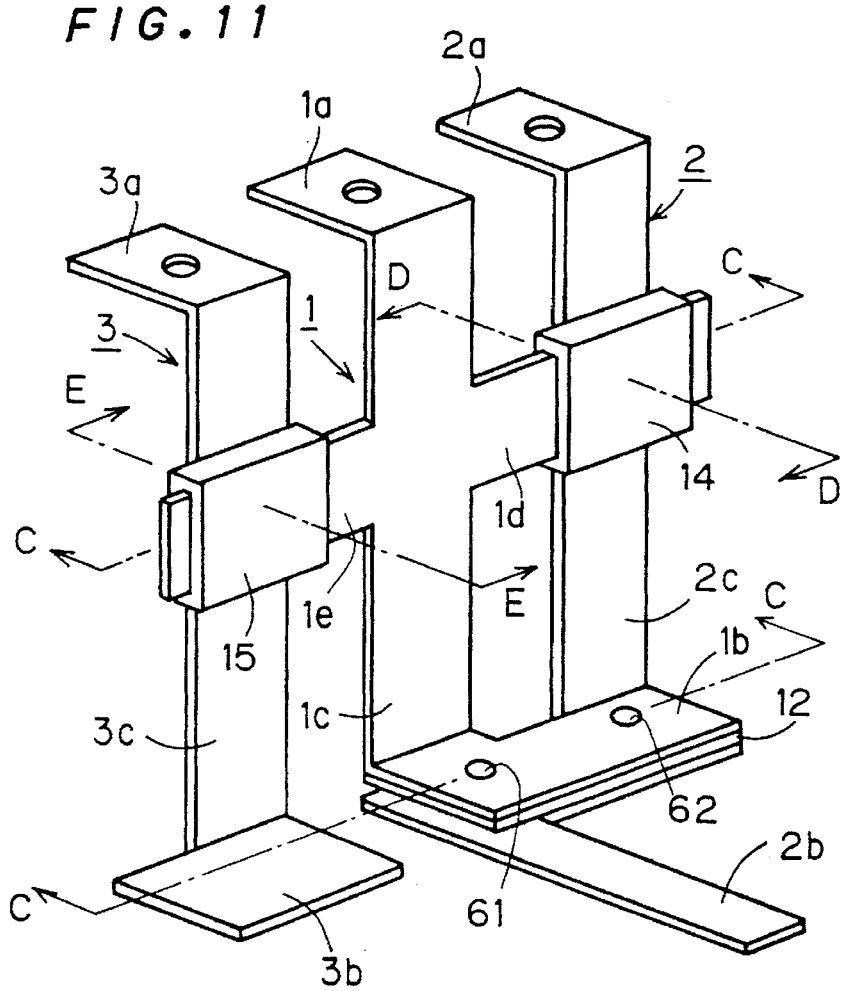
FIG. 11 is a perspective view showing main electrode plates of a device according to a second embodiment of the present invention.
Figure 12:
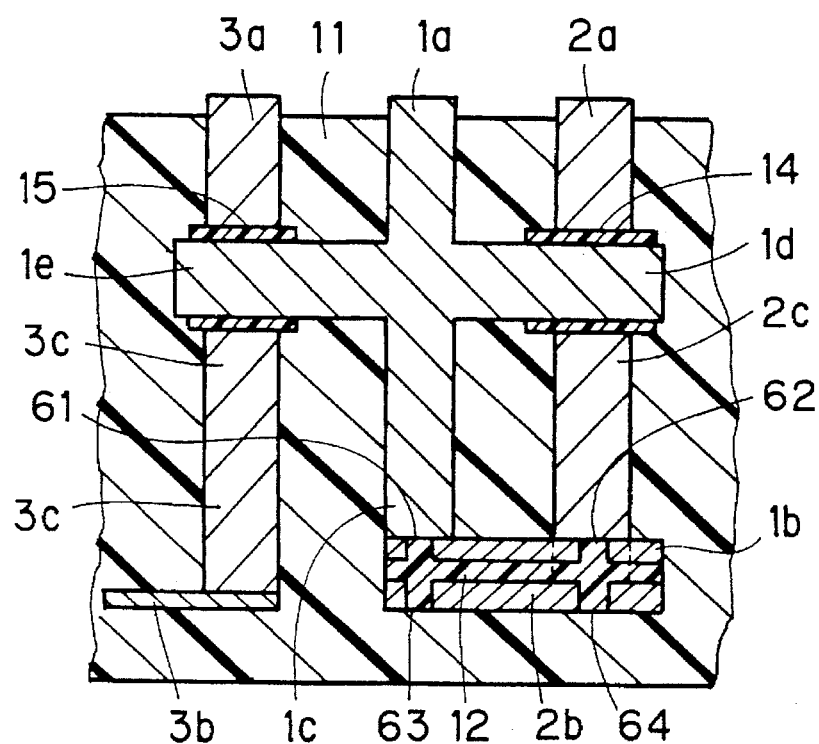
FIG. 12 is a partially fragmented sectional view of the device according to the second embodiment taken along the line C—C.
Figure 13:
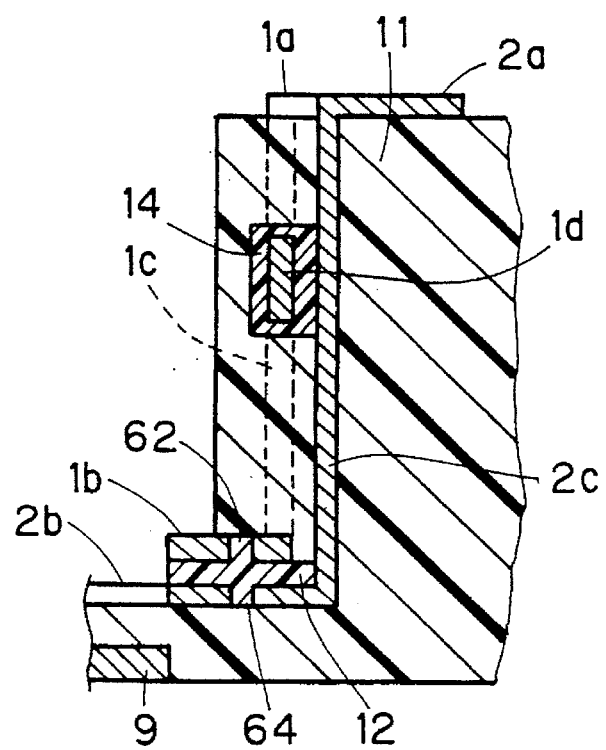
FIG. 13 is a partially fragmented sectional view of the device according to the second embodiment taken along the line D—D.
Figure 14:
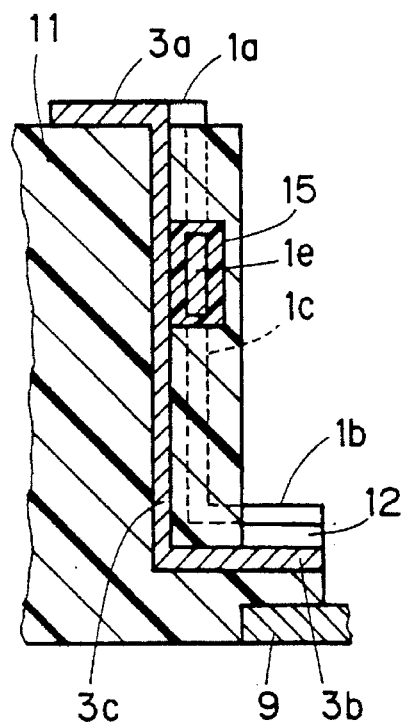
FIG. 14 is a partially fragmented sectional view of the device according to the second embodiment taken along the line E—E.

FIG. 11 is a perspective view showing the structures of main electrode plates 1, 2 and 3 which are sealed in a case 11 in a device according to a second embodiment of the present invention. FIGS. 12 to 14 are sectional views taken along the lines C—C, D—D and E—E in FIG. 11 respectively. FIGS. 12 to 14 also illustrate the case 11, along with the main electrode plates 1, 2 and 3.

As shown in FIGS. 11 to 14, this embodiment is characteristically different from the device 100 according to the first embodiment in a point that through holes are provided in pairs of positions of lower end portions 1b and 2b which are opposed to each other through a spacer 12, and projections 61, 62, 63 and 64 are provided in the spacer 12 to be engaged with the through holes. The structures of the remaining portions of the device are similar to those of the device 100, and hence redundant description is omitted.

The projections 61 to 64 are engaged with the through holes of the lower end portions 1b and 2b, thereby setting the positional relation between the lower end portions 1b and 2b and the spacer 12. Therefore, misregistration of the lower end portions 1b and 2b is prevented when the main electrode plates 1, 2 and 3 are sealed in the case 11, whereby prescribed parallelism is reliably implemented between the lower end portions 1b and 2b after the sealing, while a prescribed withstand voltage is reliably attained.

The spacer 12 pins the lower end portions 1b and 2b in pairs of portions respectively, thereby univocally deciding the positional relation between the lower end portions 1b and 2b and the spacer 12. While a similar effect is generally attained by pinning such lower end portions in at least pairs of portions, this embodiment attains the same effect in the simplest structure by limiting the pinned portions to the minimum pairs of portions.

Alternatively, the spacer 12 may pin the lower end portions 1b and 2b in single portions respectively. While the degree of freedom in rotation of the lower end portions 1b and 2b remains around the pinned portions in this case, at least the degree of freedom in translation along the major surface of the spacer 12 is constrained.

<3. Third Embodiment>

Figure 15:
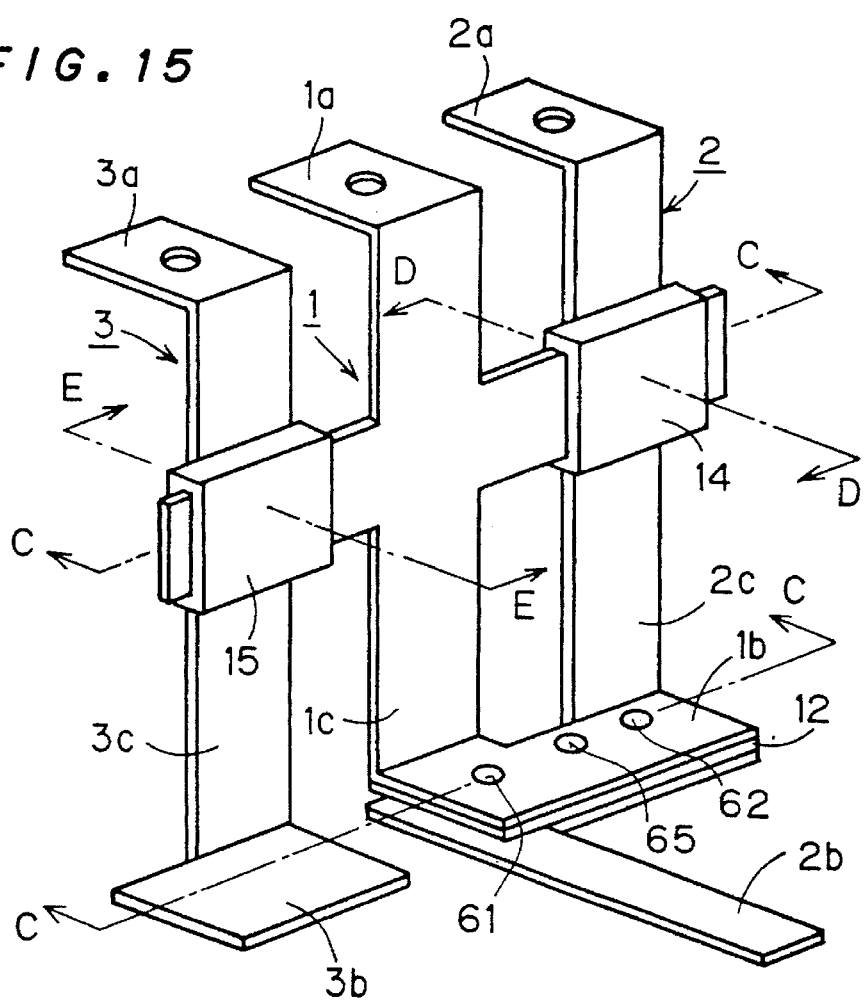
FIG. 15 is a perspective view showing main electrode plates of a device according to a third embodiment of the present invention.
Figure 16:
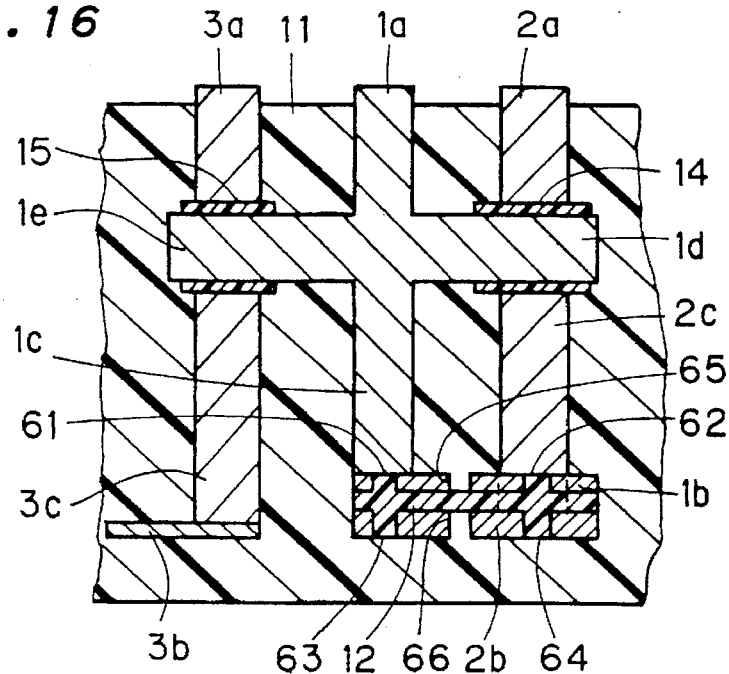
FIG. 16 is a partially fragmented view of the device according to the third embodiment taken along the line C—C.

FIG. 15 is a perspective view showing the structures of main electrode plates 1, 2 and 3 which are sealed in a case 11 in a device according to a third embodiment of the present invention. FIG. 16 is a sectional view taken along the line C—C in FIG. 15. FIG. 16 also illustrates the case 11, along with the main electrode plates 1, 2 and 3. Sectional views taken along the lines D—D and E—E in FIG. 15 are expressed identically to FIGS. 13 and 14 respectively.

As shown in FIGS. 15, 16, 13 and 14, this embodiment is characteristically different from the device according to the second embodiment in a point that through holes 65 and 66 are additionally provided in lower end portions 1b and 2b. These through holes 65 and 66 are not engaged with a spacer 12, but remain in open states. The positions for providing the through holes 65 and 66 are selected in those embedding the same in a side wall portion 24 of the case 11.

In order to connect wires 25 to the lower end portions 1b and 2b through an automatic bonding apparatus, ultrasonic waves are applied to the lower end portions 1b and 2b. According to this embodiment, the through holes 65 and 66 and the side wall portion 24 filling up the same are engaged with each other, whereby misregistration of the lower end portions 1b and 2b and the case 11 is prevented upon application of vibration by the ultrasonic waves. Namely, adhesion strength between the lower end portions 1b and 2b and the case 11 is improved by the simple structure of providing the through holes 65 and 66.

<4. Fourth Embodiment>

Figure 17:
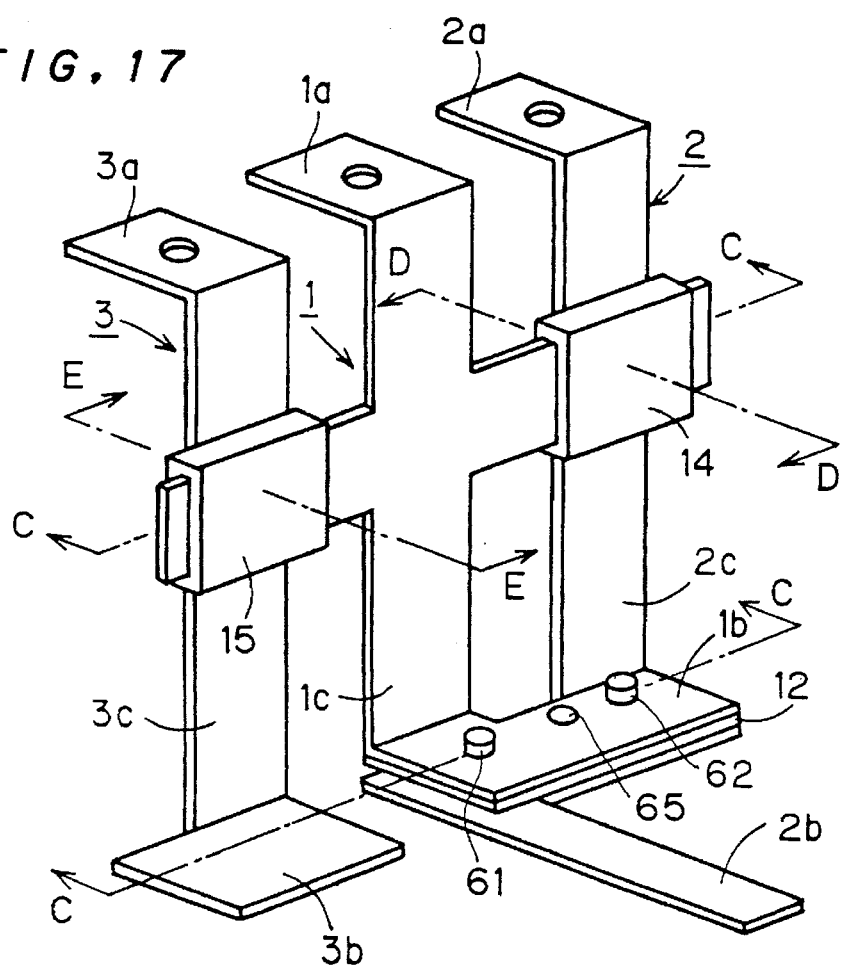
FIG. 17 is a perspective view showing main electrode plates of a device according to a fourth embodiment of the present invention.
Figure 18:
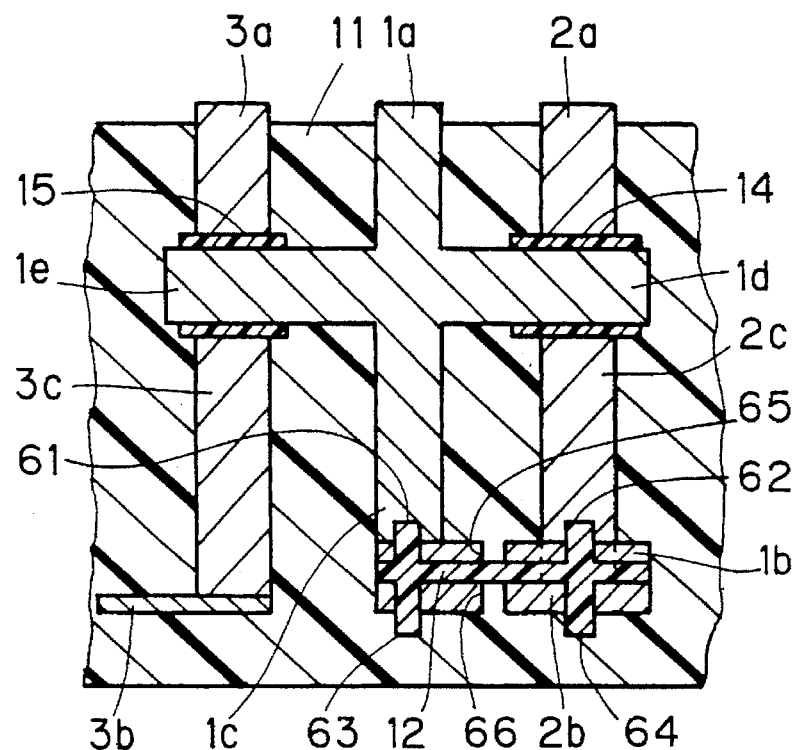
FIG. 18 is a partially fragmented sectional view of the device according to the fourth embodiment taken along the line C—C.
Figure 19:
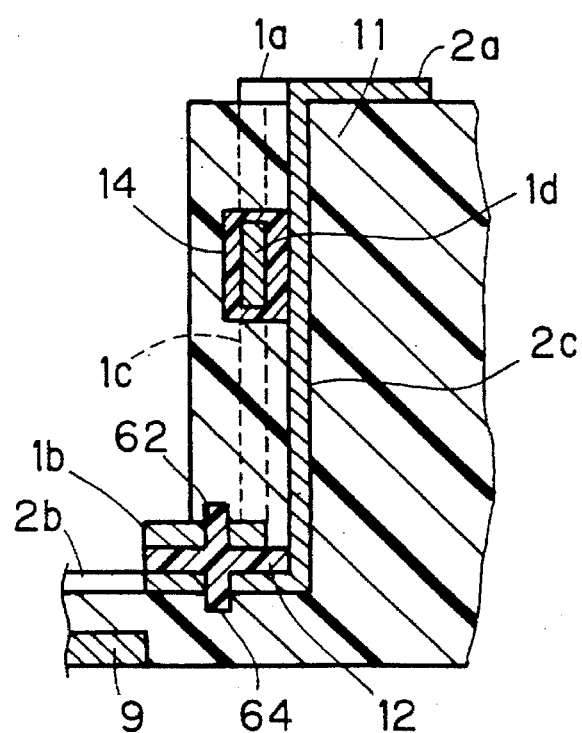
FIG. 19 is a partially fragmented sectional view of the device according to the fourth embodiment taken along the line D—D.

FIG. 17 is a perspective view showing the structures of main electrode plates 1, 2 and 3 which are sealed in a case 11 in a device according to a fourth embodiment of the present invention. FIGS. 18 and 19 are sectional views taken along the lines C—C and D—D in FIG. 17 respectively. FIGS. 18 and 19 also illustrate the case 11, along with the main electrode plates 1, 2 and 3. A sectional view taken along the line E—E in FIG. 17 is expressed identically to FIG. 14.

As shown in FIGS. 17 to 19 and 14, this embodiment is characteristically different from the device according to the second embodiment in a point that projections 61 to 64 extend to outwardly project from the surfaces of lower end portions 1b and 2b. Further, through holes of the lower end portions 1b and 2b which are engaged with the projections 61 to 64 are provided in positions for embedding the projections 61 to 64 in a side wall portion 24 of the case 11. Namely, the projections 61 to 64 are sealed in the side wall portion 24.

Consequently, the projections 61 to 64 are stopped by the side wall portion 24, whereby misregistration of the lower end portions 1b and 2b and the case 11 is prevented upon application of vibration by ultrasonic waves etc. Namely, adhesion strength between the lower end portions 1b and 2b and the case 11 is improved by the simple structure of making the projections 61 to 64 protrude.

As shown in FIGS. 17 to 19 and 14, through holes 65 and 66 may be provided similarly to the third embodiment, while making the projections 61 to 64 protrude. The adhesion strength is further improved by providing both of these elements.

<5. Fifth Embodiment>

Figure 20:
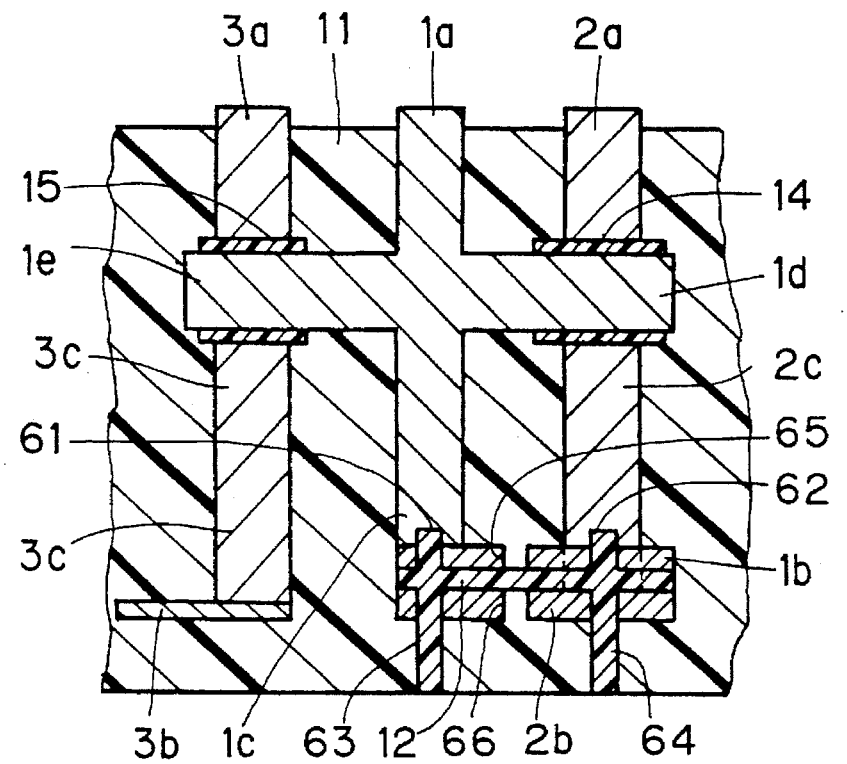
FIG. 20 is a partially fragmented sectional view of a device according to a fifth embodiment of the present invention taken along the line C—C.
Figure 21:
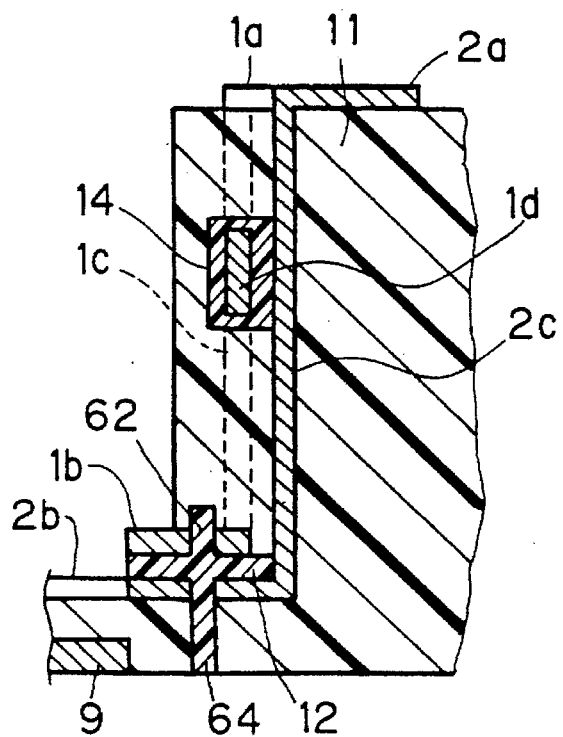
FIG. 21 is a partially fragmented sectional view of the device according to the fifth embodiment taken along the line D—D.

The structures of main electrodes 1, 2 and 3 which are sealed in a case 11 in a device according to a fifth embodiment of the present invention are expressed identically to the perspective view of FIG. 17. FIGS. 20 and 21 are sectional views taken along the lines C—C and D—D in this embodiment respectively. FIGS. 20 and 21 also illustrate a case 11, along with the main electrode plates 1, 2 and 3. A sectional view taken along the line E—E is expressed identically to FIG. 14.

As shown in FIGS. 17, 20, 21 and 14, this embodiment is characteristically different from the device according to the fourth embodiment in a point that projections 63 and 64 protrude to reach an outer surface of a bottom surface portion 23 of the case 11. When the main electrode plates 1, 2 and 3 are sealed in the case 11, therefore, the projections 63 and 64 can be brought into contact with a surface of a mold for sealing the case 11.

Thus, the main electrode plates 1 and 2 are fixed to the mold in sealing. Consequently, it is possible to prevent the main electrode plates 1 and 2 from misregistration caused by an injection pressure in a process of injecting sealing resin for forming the case 11 into the mold. Namely, the positional relation between the main electrode plates 1 and 2 and the case 11 is accurately set after the sealing.

<6. Sixth Embodiment>

Figure 22:
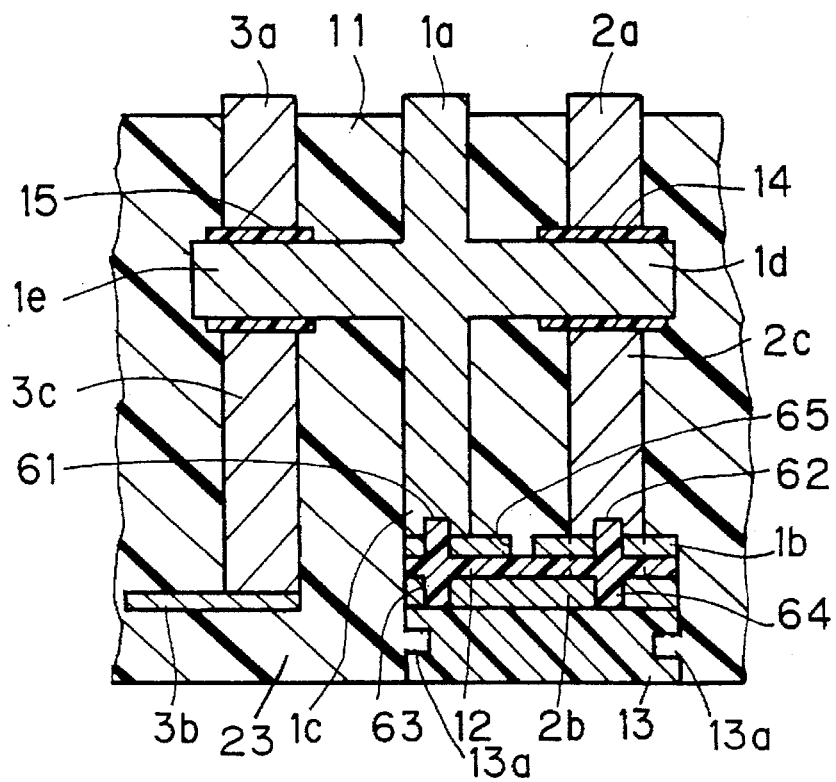
FIG. 22 is a partially fragmented sectional view of a device according to a sixth embodiment of the present invention taken along the line C—C.
Figure 23:
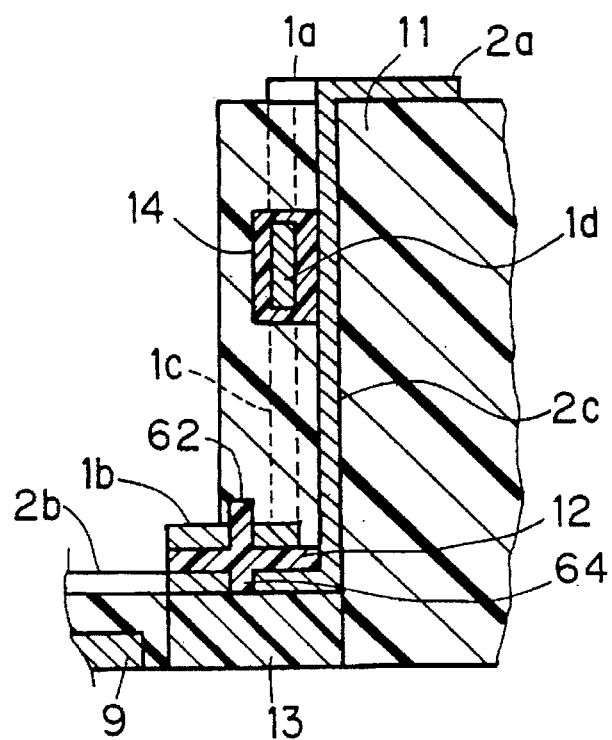
FIG. 23 is a partially fragmented sectional view of the device according to the sixth embodiment taken along the line D—D.

The structures of main electrode plates 1, 2 and 3 which are sealed in a case 11 in a device according to a sixth embodiment of the present invention is expressed identically to the perspective view of FIG. 17. FIGS. 22 and 23 are sectional views taken along the lines C—C and D—D in this embodiment respectively. FIGS. 22 and 23 also illustrate the case 11, along with the main electrode plates 1, 2 and 3. A sectional view taken along the line E—E is expressed identically to FIG. 14.

As shown in FIGS. 17, 22, 23 and 14, projections 63 and 64 only pass through a lower end portion 2b, not to protrude outwardly from the surface of the lower end portion 2b. Further, forward end surfaces of the projections 63 and 64 are flush with the surface of the lower end portion 2b. A further spacer (insulator) 13 which is in the form of a flat plate is provided under the lower end portion 2b.

The spacer 13 is made of an electrical insulating material, preferably of the same material as those for spacers 12, 14 and 15. The lower surface of the spacer 13 is flush with the outer surface of a bottom surface portion 23 of the case 11, while its upper surface is in contact with the surface of the lower end portion 2b and forward end surfaces of the projections 63 and 64.

When the main electrode plates 1, 2 and 3 are sealed in the case 11, the spacer 13 is previously interposed along with the spacers 12, 14 and 15. Then, the bottom surface of the spacer 13 is brought into contact with the surface of a mold for sealing the case 11, so that the lower end surfaces 1b and 2b overlapping with each other through the spacer 12 are placed thereon. Thus, the main electrode plates 1 and 2 are fixed to the mold through the spacer 13. Consequently, the positional relation between the main electrode plates 1 and 2 and the case 11 is accurately set after the sealing.

As shown in FIG. 22, a groove 13a is preferably provided in the spacer 13. Adhesion strength between the spacer 13 and the case 11 is improved by the groove 13a. A similar effect can be attained by providing a projection in place of the groove 13a.

<7. Seventh Embodiment>

Figure 24:
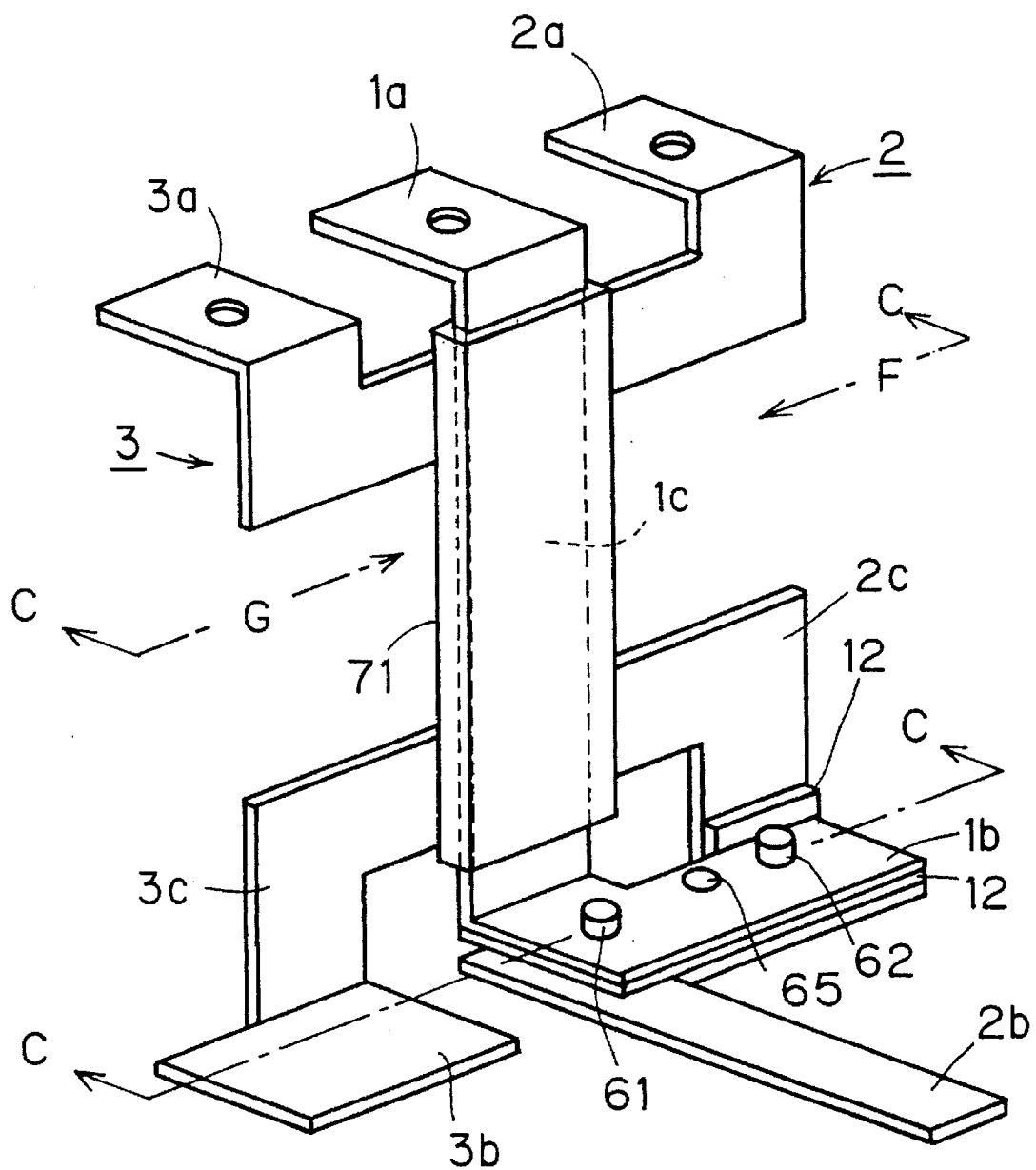
FIG. 24 is a perspective view showing main electrode plates of a device according to a seventh embodiment of the present invention.
Figure 25:
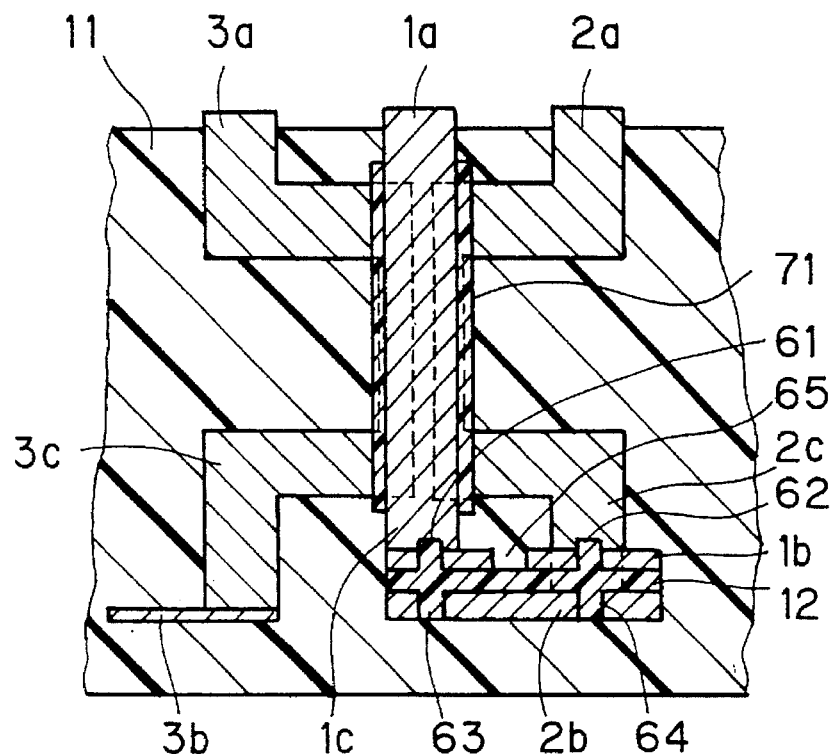
FIG. 25 is a partially fragmented sectional view of the device according to the seventh embodiment taken along the line C—C.
Figure 26:
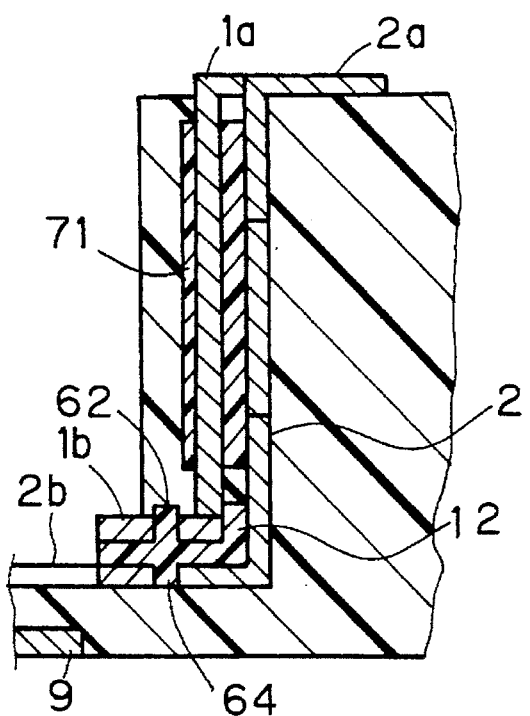
FIG. 26 is a partially fragmented sectional view of the device according to the seventh embodiment taken along the line D—D.
Figure 27:
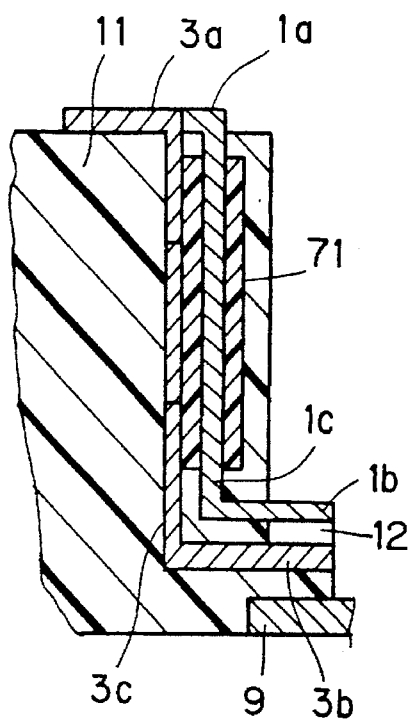
FIG. 27 is a partially fragmented sectional view of the device according to the seventh embodiment taken along the line E—E.

FIG. 24 is a perspective view showing the structures of main electrode plates 1, 2 and 3 which are sealed in a case 11 in a device according to a seventh embodiment of the present invention. FIGS. 25 to 27 are sectional views taken along the lines C—C, D—D and E—E in FIG. 24 respectively. FIGS. 25 to 27 also illustrate the case 11, along with the main electrode plates 1, 2 and 3.

As shown in FIGS. 24 to 27, both of upright portions 2c and 3c are bent in a U-shaped manner in major surfaces thereof (i.e., while keeping the major surface directions), whereby parts of the upright portions 2c and 3c are approximated to each other and opposed to an upright portion 1c. A spacer (insulator) 71 is interposed between the opposed parts of the upright portions 2c, 3c and 1c. Preferably, the spacer 17 is provided to enclose the upright portion 1c thereby being fixed to the upright portion 1c, as shown in FIGS. 24 to 27. The spacer 71 is made of an electrical insulating material, preferably from the same material as that for a spacer 12.

As shown in FIGS. 25 to 27, the thickness of the spacer 71 enclosing the upright portion 1c is constant. In the opposed parts, therefore, the upright portions 2c, 3c and 1c hold a flat portion of the spacer 71, whereby the major surfaces thereof are approximated and opposed to each other, and kept parallel to each other in high accuracy. In the opposed parts, main currents flow through the upright portions 2c, 3c and 1c in antiparallel with each other.

Similarly to lower end portions 1b and 2b which are opposed to each other through the spacer 12, parasitic inductances are particularly suppressed also in the opposed parts of the upright portions 1c, 2c and 3c. Namely, the parasitic inductances caused in the main electrode plates 1, 2 and 3 are most effectively reduced in the device according to this embodiment.

When the main electrode plates 1, 2 and 3 are sealed in the case 11, further, the spacer 71 is previously interposed along with the spacer 12. Namely, the main electrode plates 1, 2 and 3 are sealed in the case 11 with interposition of the spacer 71 between the upright portions 2c, 3c and 1c. Thus, parallelism of high accuracy can be readily attained between the upright portions 1c, 2c and 3c.

As shown in FIGS. 24 and 26, the spacer 12 preferably has an upright portion, which is interposed between the upright portions 1c and 2c. Thus, parallelism of higher accuracy is implemented between the upright portions 1c and 2c due to synergism with the spacer 71.

As shown in FIGS. 25 and 26, further, only projections 61 and 62 protrude from the lower surface of the lower end portion 1b while projections 63 and 64 do not protrude from the surface of the lower end portion 2b, among the projections 61 to 64 which are provided on the spacer 12, dissimilarly to the device according to the fourth embodiment shown in FIGS. 18 and 19. Similarly, the lower end portion 1b is provided with a through hole 65, while no through hole 66 is provided in the lower end portion 2b. Also when the projections etc. are provided on the spacer 12, the effect of the fourth embodiment of preventing misregistration between the lower end portions 1b and 2b and the spacer 12 and the case 11 is properly attained.

<8. Modification>

Figure 28:
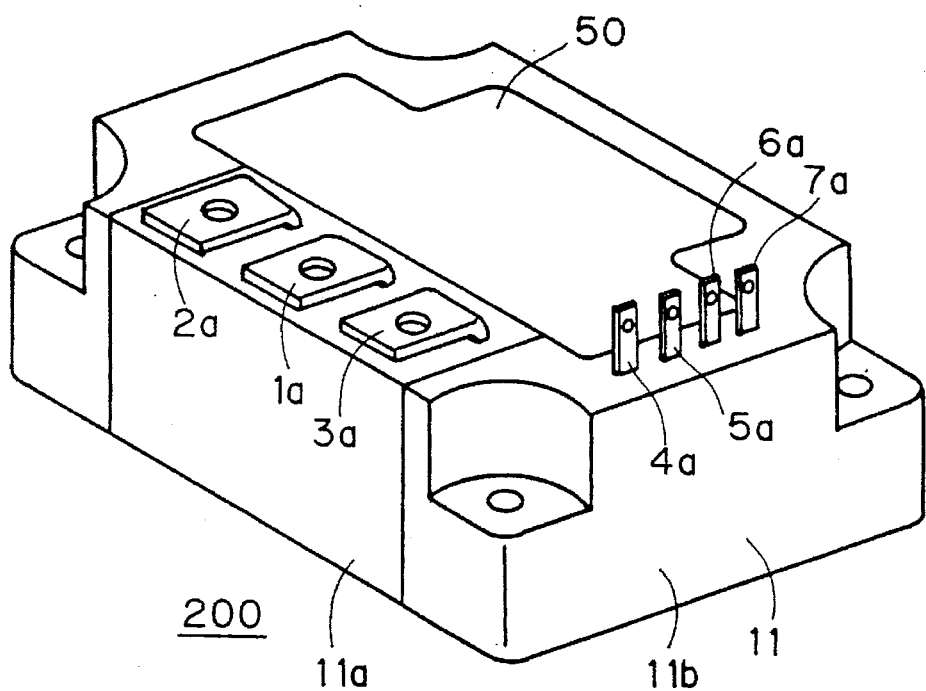
FIG. 28 is a perspective view showing the appearance of a device according to a modification.

FIG. 28 is a perspective view showing the appearance of a device 200 according to a modification of the present invention. This device 200 is characteristically different from the devices according to the first to seventh embodiments in a point that main electrode plates 1, 2 and 3 are sealed by a portion 11a of the case 11, and thereafter the portion 11a sealing the main electrode plates 1, 2 and 3 is assembled into a remaining portion 11b of the case 11, thereby forming the case 11.

Thus, the case 11 may not necessarily be entirely cast at the same time but the same may alternatively be divided into a plurality of portions which are cast independently of each other in each of the aforementioned embodiments. When one divided forming portion is cast through a mold, the main electrode plates 1, 2 and 3 may be sealed along with the spacers 12, 14 and 15 etc. in this forming portion. Also in this case, it is possible to attain an effect similar to those of the aforementioned embodiments, i.e., an effect of readily implementing parallelism in high accuracy.

Namely, the main electrode plates 1, 2 and 3 may simply be sealed in the case 11, regardless of a part or the entire part.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a circuit board being provided on a bottom surface portion of a box type electrically insulating case, a semiconductor element being provided on said circuit board for controlling a main current, and a pair of main electrodes having first end portions being electrically connected with said semiconductor element and second end portions being outwardly exposed from an upper end surface of said case so that said main current flows in opposite directions, said pair of main electrodes being sealed in the interior of a side wall portion of said case in substantially parallel positional relation thereby being fixed to said case, said first end portions of said pair of main electrodes being not directly coupled to said circuit board but electrically connected to said semiconductor element through bonding wires.

2. The semiconductor device in accordance with claim 1, wherein respective ones of said first end portions of said pair of main electrodes are in the form of plates having opposed portions being opposed in parallel with each other through a flat plate type insulator sandwiched therebetween, parts of respective ones of said opposed portions and said insulator being sealed in the interior of said side wall portion.

3. The semiconductor device in accordance with claim 2, wherein plate-type said first end portions of said pair of main electrodes are parallel to an inner surface of said bottom surface portion, while that of said first end portions being closer to said bottom surface portion outwardly extends beyond said opposed portions.

4. The semiconductor device in accordance with claim 3, wherein major surfaces of respective said first end portions of said pair of main electrodes being connected with said bonding wires are substantially flush with a major surface of said circuit board on which said semiconductor element is provided.

5. The semiconductor device in accordance with claim 4, wherein respective said first end portions of said pair of main electrodes are provided on positions being adjacent to said circuit board and closest to portions on said circuit board being connected by said bonding wires respectively.

6. The semiconductor device in accordance with claim 2, wherein projections are provided on both major surfaces of said insulator respectively while through holes are provided in said opposed portions of said first end portions of said pair of main electrodes respectively, so that said projections are engaged in said through holes.

7. The semiconductor device in accordance with claim 6, wherein
a plurality of said projections are provided on each of said major surfaces.

8. The semiconductor device in accordance with claim 6, wherein
at least one of said projections protrudes from that of said through holes being engaged therewith and is sealed in said side wall portion.

9. The semiconductor device in accordance with claim 8, wherein
the forward end portion of said projection protruding from that of said through holes being engaged therewith reaches an outer surface of said bottom surface portion of said case.

10. The semiconductor device in accordance with claim 6, wherein
still another through hole being filled up with a material forming said side wall portion is formed in at least one of said opposed portions of said first end portions of said pair of main electrodes.

11. The semiconductor device in accordance with claim 2, wherein
plate-type said first end portions of said pair of main electrodes are parallel to an inner surface of said bottom surface portion, and
a first major surface of flat plate type another insulator is in contact with one of said first end portions being closer to said bottom surface portion on a major surface opposite to that being in contact with said insulator,
another major surface of said another insulator being flush with an outer surface of said bottom surface portion of said case.

12. The semiconductor device in accordance with claim 11, wherein projections are provided on a side surface of said another insulator.

13. The semiconductor device in accordance with claim 11, wherein grooves are provided in a side surface of said another insulator.

14. The semiconductor device in accordance with claim 2, wherein the thickness of said insulator is in the range of about 0.5 mm to about 5 min.

15. The semiconductor device in accordance with claim 1, wherein
said pair of main electrodes are in the form of plates, and a plate-type arm portion being opposed in parallel to a major surface of one of said main electrodes with a flat insulator being sandwiched therebetween protrudes from the other of said main electrodes in portions of said pair of main electrodes being sealed in the interior of said side wall portion.

16. The semiconductor device in accordance with claim 15, wherein
said insulator encloses said arm portion, and is flat at least in a portion being opposed to said major surface of said one of said main electrode.

17. The semiconductor device in accordance with claim 1, wherein
said pair of main electrodes are in the form of plates, said first end portions of said pair of main electrodes being parallel to an inner surface of said bottom surface portion,
said pair of main electrodes being sealed in said side wall portion in connecting portions respectively connecting said first end portions with said second end portions and in parts of said first end portions, and having opposed portions where said major surfaces are opposed in parallel with each other in both of said connecting portions and said first end portions.

18. The semiconductor device in accordance with claim 17, wherein
said opposed portions are opposed to each other through a flat portion of an insulator sandwiched therebetween, said insulator having said flat portion, and at least a part of said insulator being sealed in said side wall portion.

19. The semiconductor device in accordance with claim 18, wherein said insulator encloses one of said pair of main electrodes.

20. The semiconductor device in accordance with claim 1, wherein
said semiconductor element has a power switching semiconductor element, and a radiation plate consisting of a heat conductive metal is fixed to a major surface of said circuit board being opposite to that on which said semiconductor element is provided, a major surface of said heat radiation plate being opposite to that fixed to said circuit board being exposed to the exterior of said bottom surface portion.

* * * * *